(12) United States Patent
Takashima et al.

(10) Patent No.: US 6,720,124 B2
(45) Date of Patent: Apr. 13, 2004

(54) RECORDING MATERIAL

(75) Inventors: Masanobu Takashima, Shizuoka-ken (JP); Hiroshi Sato, Shizuoka-ken (JP); Yoshimitsu Arai, Shizuoka-ken (JP); Kyoko Hanasaki, Shizuoka-ken (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

(21) Appl. No.: 10/158,210

(22) Filed: May 31, 2002

(65) Prior Publication Data

US 2003/0073025 A1 Apr. 17, 2003

(30) Foreign Application Priority Data

Jun. 1, 2001 (JP) ........................................ 2001-166731
Apr. 1, 2002 (JP) ........................................ 2002-098759

(51) Int. Cl.[7] ............................ G03F 7/004; G03F 7/027
(52) U.S. Cl. ...................... 430/138; 430/157; 430/162; 430/177; 430/281.1
(58) Field of Search ................................ 430/138, 157, 430/162, 177, 281.1

(56) References Cited

U.S. PATENT DOCUMENTS 3,493,374 A * 2/1970 Roncken et al. ............ 430/159
3,615,537 A * 10/1971 Giesen et al. ............... 430/174
4,957,847 A * 9/1990 Adam et al. ................ 430/170
5,424,268 A   6/1995 Fehervari et al.
5,773,186 A * 6/1998 Takashima .................. 430/138
6,348,433 B1  2/2002 Jimbo et al.

FOREIGN PATENT DOCUMENTS

| JP | 57-124343 | 8/1982 |
| JP | 57-179836 | 11/1982 |
| JP | 57-197538 | 12/1982 |
| JP | 3-87827 | 4/1991 |
| JP | 4-10879 | 2/1992 |
| JP | 4-211252 | 8/1992 |
| JP | 4-75147 | 11/1992 |
| JP | 9-286782 | 11/1997 |
| JP | 9-286783 | 11/1997 |
| JP | 2000-239263 | 9/2000 |

\* cited by examiner

*Primary Examiner*—John S. Chu
(74) *Attorney, Agent, or Firm*—Sughrue Mion, PLLC

(57) ABSTRACT

A recording material includes a support having disposed thereon a recording layer including at least: a diazo compound having no diazonio group; a coupler compound that colors by reacting with the diazo compound; and a polymerizable compound.

20 Claims, No Drawings

RECORDING MATERIAL

BACKGROUND OF THE INVENTION

1. Field of the Invention

The present invention relates to novel recording materials and, more particularly, to a recording material used in connection with organic dyes having excellent image fastness, ink, color filters, holograms, proofs, sealants, adhesives, planography, resin letterpress, photoresists and the like.

2. Description of the Related Art

Photopolymerizable compositions basically include a photopolymerization initiator and an addition-polymerizable compound (hereinafter referred to as a polyfunctional monomer) containing at least two ethylenically unsaturated bonds in a molecule. When irradiated with light, the photopolymerizable compositions are cured, viscidity changes, and the photopolymerizable compositions are rendered insolubile in a solvent. By making use of these characteristics, the photopolymerizable composition is broadly used in photography, printing, the treatment of metal surfaces, and in ink. Functions and application examples thereof are described in a number of references, such as *Light Sensitive Systems* by Jaromir Kosar (John Wiley & Sons: New York, 1965; pp. 158–193) and *Imaging Systems* by K. I. Jacobson and R. E. Jacobson (John Wiley & Sons: New York, 1976; pp. 181–222).

In recent years, image forming systems have been proposed that utilize photosensitive microcapsules, i.e., microcapsules that contain photopolymerizable compositions. For example, Japanese Patent Application Laid-open (JP-A) Nos. 57-124343, 57-179836, and 57-197538 disclose methods for forming dye images, in which microcapsules that contain a dye and a photopolymerizable composition comprising a vinyl compound and a photopolymerization initiator are coated on a color-forming sheet. The color-forming sheet is then exposed to light and superposed on an image-receiving sheet, and then pressure is applied to both sheets.

Additionally, JP-A Nos. 3-87827 and 4-211252 disclose photo- and heat-sensitive color-forming recording materials containing two components. One component is contained in microcapsules. The other component is a curable compound of a photocurable composition, or is present outside the microcapsules together with the photocurable composition. The latter recording material is disposed with a layer comprising microcapsules that contain an electron-donating colorless dye and, outside the microcapsule, a photocurable composition containing an electron-accepting compound, a polymerizable vinyl monomer and a photopolymerization initiator.

Recording materials utilizing photopolymerizable compositions are particularly advantageous from an environmental standpoint, because image recording can be accomplished by a dry process without using a developing solution, and because no waste is generated.

Japanese Patent Application Bulletin (JP-B) Nos. 4-75147 and 4-10879 disclose recording materials that contain at least a diazonium salt compound having a diazonio group ($-N_2^+$) and a coupler compound that colors by reacting with the diazonium salt compound. These recording materials are favorable because image recording can be accomplished without a developing solution at the time of the color-forming reaction. However, there are problems in that the diazonium salt is a compound having a counter anion corresponding to the diazonio group and has in itself insufficient thermal stability. Moreover, a basic component is needed to neutralize an acidic component of the counter anion that is generated as a byproduct during the color-forming reaction with the coupler. Thus, the solid content of the recording material increases and it becomes easy for image quality to be adversely effected.

In order to tackle this problem, JP-A No. 9-286782 discloses a recording material that utilizes a color-forming reaction between a coupler compound and a diazo compound that does not have a diazonio group. This diazo compound is preferable because it does not have a counter anion, and therefore no acidic component of a counter anion is generated during the color-forming reaction. However, there is a demand for improvement with respect to high-speed photofixation properties.

In this connection, it is advantageous if, at the time an image is recorded on the photosensitive recording material, it is possibile to use not only ultraviolet light and short-wave visible light but inexpensive infrared lasers, blue-red lasers, and LEDs.

Thus, although recording materials utilizing photopolymerizable compounds are favorable from the standpoints of high sensitivity and high-speed photofixation properties, there are many cases in which sufficient image fastness cannot be obtained, and further improvements in image fastness are in demand.

SUMMARY OF THE INVENTION

The present invention was devised in order to eliminate the foregoing problems in the prior art and to attain the following object.

Namely, it is an object of the invention to provide a recording material on which a highly sensitive image can be recorded and photofixed at high speed using not only ultraviolet light but visible to infrared light in a completely dry processing system that does not require a developing solution and therefore does not generate waste, that has excellent decoloring at non-image portions (background portions), that forms a sharp high-contrast black-and-white or color image, and that has excellent image fastness.

The foregoing problems in the prior art are solved by the following aspects of the invention.

A first aspect of the invention is a recording material comprising a support having disposed thereon a recording layer including at least a diazo compound having no diazonio group, a coupler compound that colors by reacting with the diazo compound, and a polymerizable compound.

A second aspect of the invention is the recording material according to the first aspect, wherein the recording layer further includes a polymerization initiator A third aspect of the invention is the recording material according to the first aspect, wherein the polymerizable compound has an ethylenically unsaturated bond.

A fourth aspect of the invention is the recording material according to the third aspect, wherein the polymerizable compound includes at least one selected from the group consisting of an acrylic acid ester, an acrylic acid derivative, acrylic acid, an acrylic acid salt, a methacrylic acid ester, a methacrylic acid derivative, methacrylic acid, a methacrylic acid salt, maleic anhydride, a maleic acid ester, itaconic acid, an itaconic acid ester, styrene, a vinyl ether, a vinyl ester, an N-vinylheterocycle, an allyl ether, and an allyl ester.

A fifth aspect of the invention is the recording material according to the second aspect, wherein the polymerization initiator comprises a compound that absorbs light having a wavelength of 300 nm or longer, and a radical generating agent that generates a radical by interacting with the compound.

A sixth aspect of the invention is the recording material according to the fifth aspect, wherein the radical generating agent includes at least one selected from the group consisting of an organic boron compound, a diaryliodonium salt, an iron allene complex, an S-triazine derivative having a trihalogen-substituted methyl group, an organic peroxide, titanocene, a 2,4,5-triarylimidazole dimer, and an adinium salt compound.

A seventh aspect of the invention is the recording material according to the first aspect, wherein the polymerizable compound comprises a coupler compound.

An eighth aspect of the invention is the recording material according to the first aspect, wherein the coupler compound includes at least one selected from the group consisting of coupler compounds represented by the following general formulae (C-1) to (C-12):

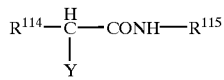
(C-1)

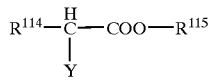
(C-2)

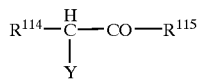
(C-3)

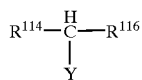
(C-4)

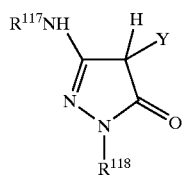
(C-5)

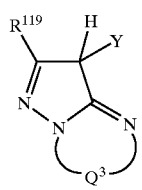
(C-6)

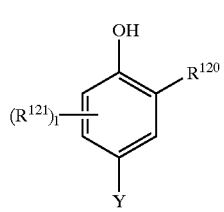
(C-7)

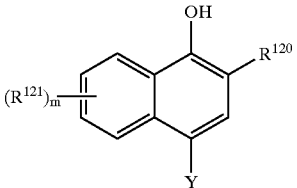
(C-8)

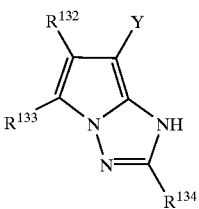
(C-9)

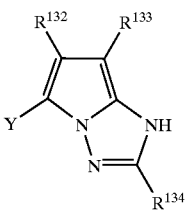
(C-10)

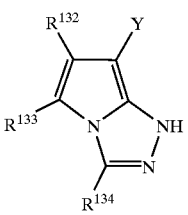
(C-11)

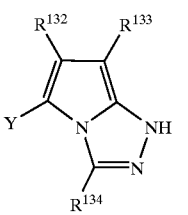
(C-12)

wherein $R^{114}$ represents any one of an acyl group, a cyano group, a nitro group, an aryl group, a heterocyclic residue, an alkoxycarbonyl group, an aryloxycarbonyl group, a carbamoyl group, a sulfamoyl group, an alkylsulfonyl group, and an arylsulfonyl group, and any group may have a substituent; $R^{115}$ represents any one of an alkyl group, an aryl group, and a heterocyclic residue, and any group may have a substituent; $R^{116}$ represents an aryl group or a heterocyclic residue, and either group may have a substituent; Y represents a hydrogen atom or a group releasable by a coupling reaction with the diazo compound; each of $R^{114}$ and $R^{115}$, and $R^{114}$ and $R^{116}$, may form a ring by bonding with each other; $R^{117}$ represents any one of an alkyl group, an aryl group, an acyl group and a carbmoyl group; $R^{118}$ represents a phenyl group, or a phenyl group that is substituted with at least one atom or one group selected from the group consisting of a halogen atom, an alkyl group, a cyano group, an alkoxy group, an alkoxycarbonyl group and an acylamino group; $R^{119}$ represents a hydrogen atom or a substituent; $Q^3$ represents a non-metallic atomic group necessary for forming a 5-membered azole ring having 2 to 4 nitrogen atoms, and the azole ring may have a substituent (including a condenstion ring); $R^{120}$ represents a hydrogen atom or a group selected from the group consisting of —$CONR^{122}R^{123}$, —$SO_2NR^{122}R^{123}$, —$NHCOR^{122}$, —$NHCONR^{122}R^{123}$, and —$NHSO_2NR^{122}R^{123}$, with each of $R^{122}$ and $R^{123}$ independently representing a hydrogen atom or a substituent; $R^{121}$ represents a substituent; l represents an integer of 0 to 2; m represents an integer of 0 to 4, and when l and m are each independently 2 or more, plural $R^{121}$ may differ from each other; and each of $R^{132}$, $R^{133}$, and $R^{134}$ independently represents a hydrogen atom or a substituent.

A ninth aspect of the invention is the recording material according to the first aspect, wherein the polymerizable compound comprises a diazo compound having no diazonio group.

A tenth aspect of the invention is the recording material according to the first aspect, wherein the diazo compound has a partial skeleton represented by the following general formula (1):

General Formula (1)

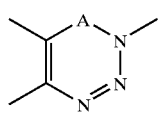

wherein A represents —CO— or —$SO_2$—.

An eleventh aspect of the invention is the recording material according to the first aspect, wherein the diazo compound includes a compound represented by the following general formula (2):

General Formula (2)

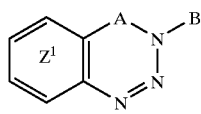

wherein A represents —CO— or —$SO_2$—; B represents an electron-attractive group; A benzene ring $Z^1$ may be condensed with another benzene ring, and the benzene ring $Z^1$ and a resultant condensation ring may have a substituent.

A twelfth aspect of the invention is the recording material according to claim 1, wherein the diazo compound includes a compound represented by the following general formula (3):

General Formula (3)

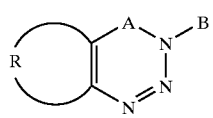

wherein A represents —CO— or —$SO_2$—; B represents an electron-attractive group; R represents an atomic group necessary for forming a 5- or 6-membered heterocycle.

A thirteenth aspect of the invention is the recording material according to the twelfth aspect, wherein the heterocycle formed by R is at least one selected from the group consisting of a nitrogen-containing heterocycle, oxygen-containing heterocycle and sulfur-containing heterocycle.

A fourteenth aspect of the invention is the recording material according to the first aspect, wherein a maximum abosorption wavelength of the diazo compound is 450 nm or less.

A fifteenth aspect of the invention is the recording material according to the first aspect, wherein the coupler compound or the diazo compound is enclosed in a microcapsule.

A sixteenth aspect of the invention is the recording material according to the first aspect, wherein the recording layer includes a microcapsule thermoplasticizer.

A seventeenth aspect of the invention is the recording material according to the first aspect, wherein the polymerizable compound is a microcapsule thermoplasticizer.

An eighteenth aspect of the invention is the recording material according to the sixteenth aspect, wherein the thermoplasticizer includes at least one selected from the group consisting of a phenol derivative, a naphthol derivative, an alkoxy-substituted benzene derivative, an alkoxy-substituted naphthalene derivative, a benzene sulfonamide derivative, and a carbamoylalkyloxybenzene derivative.

A nineteenth aspect of the invention is the recording material according to the first aspect, wherein the recording layer includes an organic base.

A twentieth aspect of the invention is the recording material according to the first aspect, further comprising a multi-layer structure comprising a first recording layer which is sensitive to light having a central wavelength $\lambda_1$, a second recording layer which is sensitive to light having a central wavelength $\lambda_2$ to form color different from color to be formed by the first recording layer, . . . , and an i th recording layer which is sensitive to light having a central wavelength $\lambda_i$ to form color different from color to be formed by the first, the second, . . . or the (i−1)th recording layer, wherein the first recording layer, the second recording layer, . . . , the (i−1)th recording layer, the i th recording layer are provided one on another in this order.

DESCRIPTION OF THE PREFERRED EMBODIMENTS

A recording material of the present invention comprises a support having disposed thereon a recording layer that includes at least a diazo compound having no diazonio group, a coupler compound that colors by reacting with the diazo compound, and a polymerizable compound. The polymerizable compound may be the diazo compound or the coupler compound.

Since the recording layer contains the polymerizable compound, the recording material not only has excellent image fastness in image portions, but also high sensitivity and is high fixing speed. With this recording material, a highly sensitive image can be recorded and photofixed at high speed using not only ultraviolet light but visible to infrared light in a completely dry processing system that does not require a developing solution and therefore does not generate waste, there is excellent decoloring at non-image portions (background portions), a sharp high-contrast black-and-white or color image can be formed, and there is excellent image fastness.

Hereinafter, the diazo compound, the coupler compound and the polymerizable compound used in the recording material of the invention will sequentially be described.

Diazo Compound

The diazonio group of the "diazo compound having no diazonio group" herein indicates a group represented as —$N_2^+$. The diazo compound having no diazonio group is preferably a compound containing a partial skeleton represented by the following general formula (1).

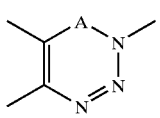

General Formula (1)

In general formula (1), A represents —CO— or —SO$_2$—.

The diazo compound is also preferably a compound represented by the following general formula (2).

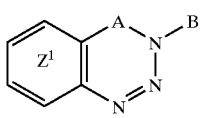

General Formula (2)

In general formula (2), A represents —CO— or —SO$_2$— and B represents an electron-attractive group. The benzene ring Z$^1$ may be condensed with another benzene ring and, in this case, the benzene ring Z$^1$ and resultant condensation ring may have a substituent. Examples of such substituents include a carboxyl group, a sulfo group, a cyano group, a halogen atom (for example, a fluorine atom, a chlorine atom, or a bromine atom), a hydroxy group, an alkoxycarbonyl group having 30 carbon atoms or less (for example, a methoxycarbonyl group, an ethoxycarbonyl group, or a benzyloxycarbonyl group), an alkylsulfonylaminocarbonyl group having 30 carbon atoms or less, an arylsulfonylaminocarbonyl group, an alkylsulfonyl group, an arylsulfonyl group, an acylaminosulfonyl group having 30 carbon atoms or less, an alkoxy group having 30 carbon atoms or less (for example, a methoxy group, an ethoxy group, a benzyloxy group, a phenoxyethoxy group, or a phenethyloxy group), an alkylthio group having 30 carbon atoms or less (for example, a methylthio group, an ethylthio group, or a dodecylthio group), an aryloxy group having 30 carbon atoms or less (for example, a phenoxy group, a p-tolyloxy group, a 1-naphthoxy group, or a 2-naphthoxy group), a nitro group, an alkyl group having 30 carbon atoms or less, an alkoxycarbonyloxy group, an aryloxycarbonyloxy group, an acyloxy group having 30 carbon atoms or less (for example, an acetyloxy group, or a propionyloxy group), an acyl group having 30 carbon atoms or less (for example, an acetyl group, a propionyl group, or a benzoyl group), a carbamoyl group (for example, a carbamoyl group, an N,N-dimethylcarbamoyl group, a morpholinocarbonyl group, or a piperidinocarbonyl group), a sulfamoyl group (for example, a sulfamoyl group, an N,N-dimethylsulfamoyl group, a morpholinosulfonyl group, or a piperidinosulfonyl group), an aryl group having 30 carbon atoms or less (for example, a phenyl group, a 4-chlorophenyl group, a 4-methylphenyl group, or an α-naphthyl group), a substituted amino group (for example, an amino group, an alkylamino group, a dialkylamino group, an arylamino group, a diarylamino group, or an acylamino group), a substituted ureide group, a substituted phosphono group, and a heterocyclic group. The carboxyl group, the sulfo group, the hydroxy group and the phosphono group may each be in a salt state and, in this case, examples of cations for use in forming the salt include G$^+$ and the like (described later).

B represents an electron-attractive group. "Electron-attractive group" herein indicates a substituent in which a Hammett sigma value becomes positive. For example, B may represent a group shown below, an aromatic group and a heterocyclic group.

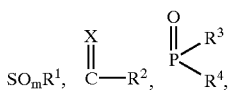

Here, m represents an integer of 1 or 2.

R$^1$ represents a hydrogen atom, an aliphatic group, an aromatic group, a heterocyclic group, or OR$^{11}$ or N(R$^{12}$)R$^{13}$, with R$^{11}$ representing a hydrogen atom, an aliphatic group, an aromatic group, or a heterocyclic group, and each of R$^{12}$ and R$^{13}$ representing a hydrogen atom, an aliphatic group, an aromatic group, a heterocyclic group, COR$^{14}$ or SO$_2$R$^{15}$. Each of R$^{14}$ and R$^{15}$ represents a hydrogen atom, an aliphatic group, an aromatic group, or a heterocyclic group.

X represents O or S.

R$^2$ represents a hydrogen atom, an aliphatic group, an aromatic group, a heterocyclic group, O—R$^{16}$, S—R$^{17}$, N(R$^{18}$)R$^{19}$, COR$^{20}$ or CO$_2$R$^{21}$, with each of R$^{16}$, R$^{17}$, R$^{20}$ and R$^{21}$ representing a hydrogen atom, an aliphatic group, an aromatic group, or a heterocyclic group, and each of R$^{18}$ and R$^{19}$ representing a hydrogen atom, an aliphatic group, an aromatic group, a heterocyclic group, COR$^{14}$ or SO$_2$R$^{15}$.

Each of R$^3$ and R$^4$ represents a hydrogen atom, an aliphatic group, an aromatic group, a heterocyclic group, or OR$^{22}$, with R$^{22}$ representing a hydrogen atom, an aliphatic group, an aromatic group, or a heterocyclic group.

Among groups represented by B, SO$_2$R$^1$ and COR$^2$ are preferable, and SO$_2$R$^1$ is particularly preferable from the standpoint of reactivity with the coupler compound.

Examples of aliphatic groups in the above-described R$^1$ to R$^4$ and R$^{11}$ to R$^{22}$ include an alkyl group, a substituted alkyl group, an alkenyl group, a substituted alkenyl group, an alkynyl group, a substituted alkynyl group, an aralkyl group, and a substituted aralkyl group. Among these groups, the alkyl group, the substituted alkyl group, the alkenyl group, the substituted alkenyl group, the aralkyl group, and the substituted aralkyl group are preferable, and, above all, the alkyl group and the substituted alkyl group are particularly preferable.

Further, the aliphatic groups may either be a cyclic aliphatic group or a chain aliphatic group. The chain aliphatic group may be branched.

Examples of the above-described alkyl groups include straight-chain, branched and cyclic alkyl groups. The number of carbon atoms in the alkyl group is preferably from 1 to 30, and more preferably from 1 to 20. The preferable range of the number of carbon atoms of the alkyl portion of the substituted alkyl group is the same that for the alkyl group. Further, the alkyl group may either be a substituted alkyl group or an unsubstituted alkyl group.

Examples of the alkyl groups include a methyl group, an ethyl group, a propyl group, a butyl group, a pentyl group, a hexyl group, an octyl group, a 2-ethylhexyl group, a decyl group, a dodecyl group, an octadecyl group, a cyclohexyl group, a cyclopentyl group, a neopentyl group, an isopropyl group, and an isobutyl group.

Examples of substituents of the substituted alkyl groups include the same substituents listed in connection with the benzene ring Z$^1$ and the condensation ring thereof.

Examples of the alkenyl groups include straight-chain, branched and cyclic alkenyl groups. The number of carbon atoms in the alkenyl group is preferably 2 to 30, and more preferably 2 to 20. The alkenyl group may also either be a substituted alkenyl group or an unsubstituted alkenyl group.

In this case, the preferable range of the number of carbon atoms of the alkenyl part of the substituted alkenyl group is the same as that for the alkenyl group.

Examples of substituents of the substituted alkenyl groups include the same substituents listed in connection with the substituted alkyl groups.

Examples of the alkynyl groups include straight-chain, branched and cyclic alkynyl groups. The number of carbon atoms in the alkynyl group is preferably 2 to 30, and more preferably 2 to 20. The alkynyl group may also either be a substituted alkynyl group or an unsubstituted alkynyl group. In this case, the preferable range of the number of carbon atoms of the alkynyl part of the substituted alkynyl group is the same as that for the alkynyl group.

Examples of substituents of the substituted alkynyl groups include the same substituents listed in connection with the substituted alkyl groups.

As the above-described aralkyl groups, any one of straight-chain, branched-chain and cyclic types is permissible. A number of carbon atoms thereof is preferably from 7 to 35, and more preferably from 7 to 25. Further, the above-described aralkyl group may either be a substituted aralkyl group or an unsubstituted aralkyl group; on this occasion, a preferable range of a number of carbon atoms of an aralkyl portion of the substituted aralkyl group is same as in the aralkyl group.

Examples of substituents of the substituted aralkyl groups include the same substituents listed in connection with the substituted alkyl groups.

As aromatic rings in the above-described $R^1$ to $R^4$ and $R^{11}$ to $R^{22}$, mentioned are, for example, an aryl group and a substituted aryl group; on this occasion, a number of carbon atoms of the aryl group is preferably from 6 to 30, and more preferably from 6 to 20. A preferable range of a number of carbon atoms of an aryl part of the substituted aryl group is same as in the aryl group. Examples of the above-described aryl groups include a phenyl group, an α-naphthyl group, and a β-naphthyl group.

Examples of substituents of the substituted aryl groups include the same substituents listed in connection with the substituted alkyl groups.

Examples of the heterocyclic groups in the above-described $R^1$ to $R^4$ and $R^{11}$ to $R^{22}$ include those containing N, O or S; on this occasion, examples of the above-described heterocyclic groups containing N, O or S include a furyl group, a thienyl group, a pyridyl group, a pyrazolyl group, an isooxazolyl group, an isothiazolyl group, an imidazolyl group, an oxazolyl group, a thiazolyl group, a pyridazyl group, a pyrimidyl group, a pyradyl group, a triazolyl group, a tetrazolyl group, a quinolyl group, a benzothiazoyl group, a benzooxazoyl group, a bendoimidazolyl group, an isoquinolyl group, a thiadiazolyl group, a morpholino group, a piperidino group, a piperazino group, an indolyl group, and an isoindolyl. These heterocyclic groups may each independently have a substitute; on this occasion, examples of such substitutes as described above include same substitutes as in the above-described benzene ring $Z^1$ and a condensation ring thereof.

Examples of sulfonyl groups of the electron-attractive group represented by the above-described B include a methane sulfonyl group, an ethane sulfonyl group, butane sulfonyl group, a benzene sulfonyl group, a 4-methylbenzene sulfonyl group, a 2-mesitylenesulfonyl group, a 4-methoxybenzene sulfonyl group, a 4-octyloxybenzene sulfonyl group, a 2,4,6-triisopropylbenzene sulfonyl group, a β-styrene sulfonyl group, a vinylbenzene sulfonyl group, a 4-chlorobenzene sulfonyl group, a 2,5-dichlorobenzene sulfonyl group, a 2,4,5-trichlorobenzene sulfonyl group, a 1-naphthalene sulfonyl group, a 2-naphthalene sulfonyl group, a quinoline sulfonyl group, a thiophene sulfonyl group, a nitrobenzene sulfonyl group, a cyanobenzene sulfonyl group, an acetylaminobenzene sulfonyl group, a butoxycarbonylbenzene sulfonyl group, a pentafluorobenzene sulfonyl group, a trifluoromethane sulfonyl group, a perfluorobutane sulfonyl group, a camphor sulfonyl group, a dimethylaminosulfonyl group, a 2-octyloxycarbonylbenzene sulfonyl group, a 3-octadecyloxycarbonylbenzene sulfonyl group, a 4-(2-ethylhexyloxycarbonyl)benzene sulfonyl group, a 4-dodecylbenzene sulfonyl group, a 2-octyloxy-5-t-octylbenzene sulfonyl group, a 4-phenoxybenzene sulfonyl group, a 4-butoxybenzene sulfonyl group, a pyridine-3-sulfonyl group, and a 2-oxo-2,3-dihydrobenzoxazole-6-sulfonyl group.

Further, examples of acyl groups of the above-described electron-attractive group include an acetyl group, a propionyl group, a butylyl group, a pivaloyl group, a lauroyl group, a stearoyl group, a benzoyl group, a cinnamoyl group, a furoyl group, a nicotinoyl group, a methoxycarbonyl group, an ethoxycarbonyl group, a phenoxycarbonyl group, a hexylaminocarbonyl group, a phenylaminocarbonyl group, a phenylsulfonylaminocarbonyl group, a dimethylaminocarbonyl group, a morpholinocarbonyl group, a trifluoroacetyl group, a methylbenzoyl group, a methoxybenzoyl group, a trifluoromethylbenzoyl group, a nitrobenzoyl group, a difluorobenzoyl group, and a pentafluorobenzoyl group.

Examples of phosphoryl groups include a diphenylphosphoryl group, and a diethylphosphoryl group.

Further, it is preferable that the above-described diazo compound is a compound represented by the following general formula (3):

General Formula (3)

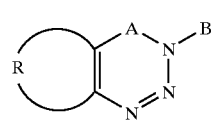

wherein R represents an atomic group necessary for forming a 5- or 6-membered heterocycle;

A and B represent same respective groups as in A and B represented by the above-described general formula (2).

It is preferable that the 5- or 6-membered heterocycle which forms R represented in the general formula (3) is a nitrogen-containing heterocycle, an oxygen-containing heterocycle or a sulfur-containing heterocycle. These heterocycles may each have a substituent. As the 5- or 6-membered nitrogen-containing heterocycle, pyrroles (condensation ring being formed at 2- and 3-positions or 3- and 4-positions), pyrazoles (condensation ring being formed at 2- and 3-positions), imidazoles (condensation ring being formed at 4- and 5-positions), triazoles (condensation ring being formed at 4- and 5-positions), pyridines (condensation ring being formed at 2- and 3-positions or 3- and 4-positions), pyrazines (condensation ring being formed at 2- and 3-positions), and the like are preferable. These heterocycles may further be condensed to form another ring. On this occasion, as the nitrogen-containing heterocycle that forms R, indoles (condensation ring being formed at 2- and 3-positions) and indolizines (condensation ring being formed at 2- and 3-positions) are particularly preferable. As the 5- or 6-membered oxygen-containing heterocycle, furans (condensation ring being formed at 2- and 3-positions), oxazoles (condensation ring being formed at 4- and 5-positions), isooxazoles (condensation ring being formed at 4- and 5-positions), and the like are preferable. These heterocycles may further be condensed to form another ring.

As the 5- or 6-membered sulfur-containing heterocycle, thiophens (condensation ring being formed at 2- and 3-positions), thiazoles (condensation ring being formed at 4- and 5-positions), isothiazoles (condensation ring being formed at 4- and 5-positions), and the like are preferable. These heterocycles may further be condensed to form another ring.

When at least one of the polymerizable compounds is the above-described diazo compound, the polymerizable group can substitute the above-described diazo compound directly or via a divalent connecting group. The polymerizable group may be any one of a radically polymerizable type, a cationically polymerizable type and a photodimerizable type.

Among them, the radically polymerizable type is preferable in view of photopolymerization sensitivity. It is preferable that at least one of these polymerizable groups substitute the above-described diazo compound per a molecule of the diazo compound. Examples of the polymerizable groups may further include a polymerizable portion as shown in paragraphs of from 0029 to 0044 of Japanese Patent Application No. 2000-142112 or a part thereof.

Examples of the divalent connecting groups which each connect the above-described diazo compound with the polymerizable group include such a divalent connecting group as shown in paragraphs of from 0031 to 0032 of JP-A No. 10-142724.

Specific examples of the diazo compounds of the invention include not only those described in paragraphs [0008] to [0034] of JP-A No. 9-286782, paragraphs [0009] to [0033] of JP-A No. 9-286783, and paragraphs [0039] to [0046] of JP-A No. 2000-239263, but also the compounds shown below.

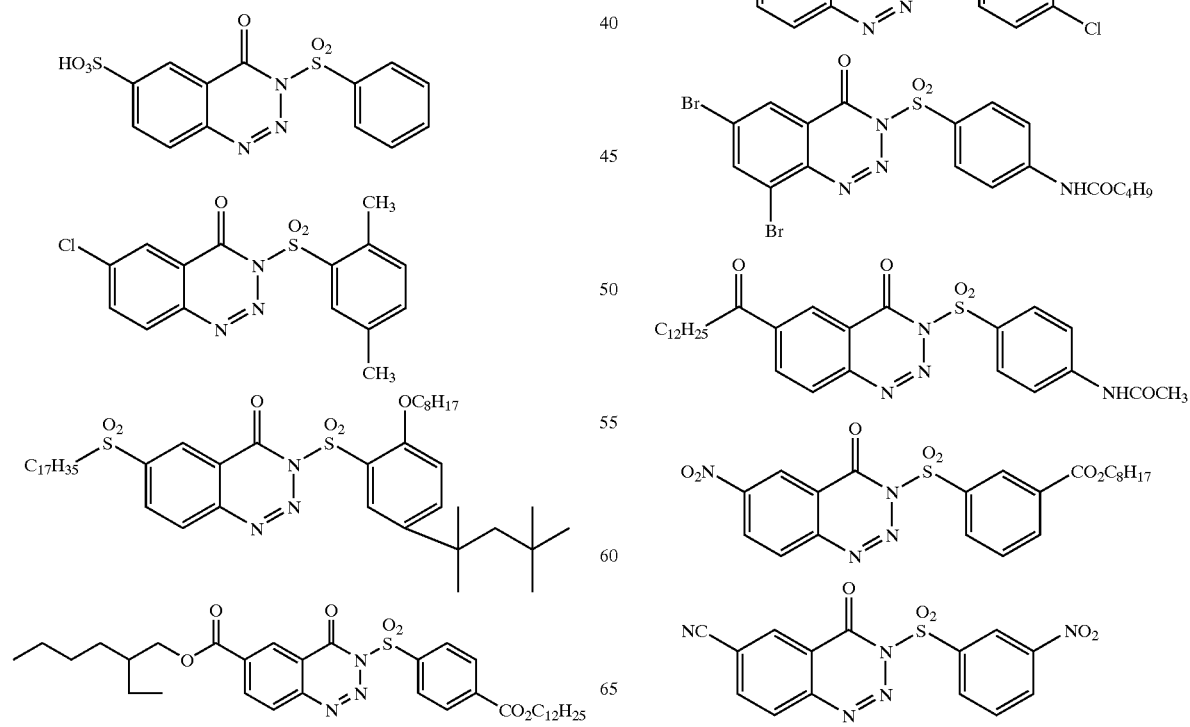

-continued
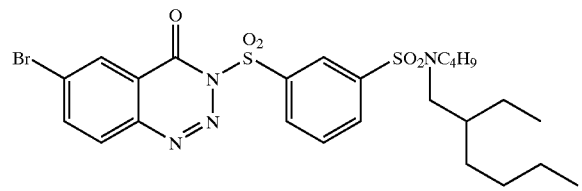
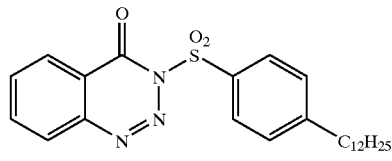
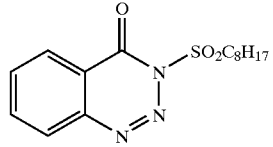
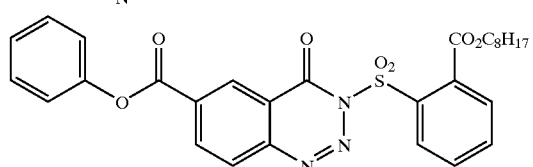
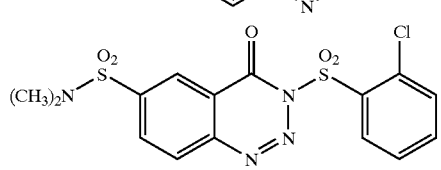
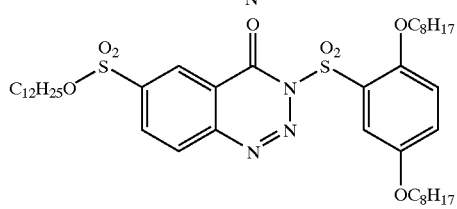
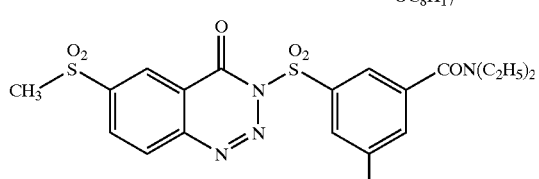
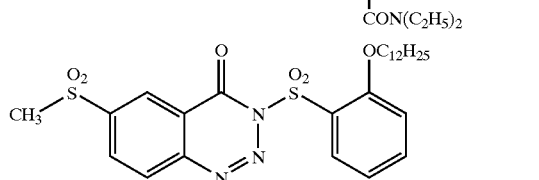
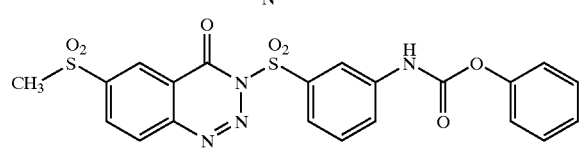
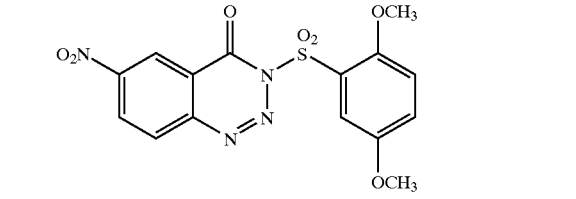
-continued
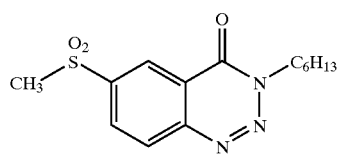
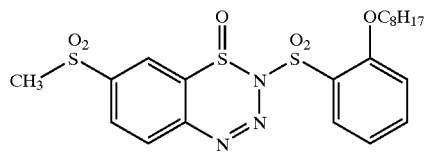
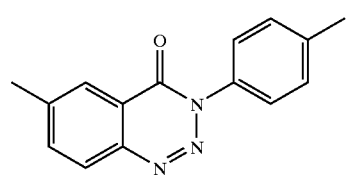
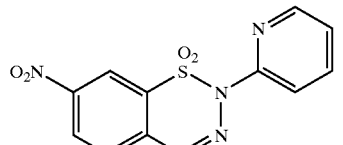
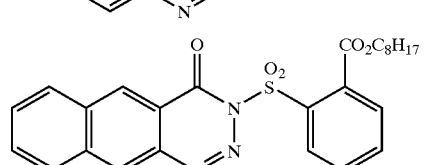
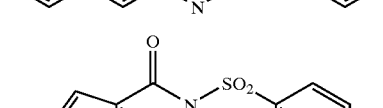
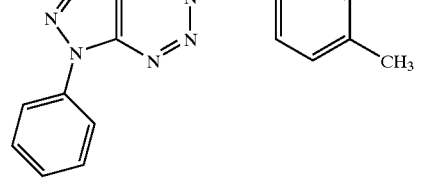
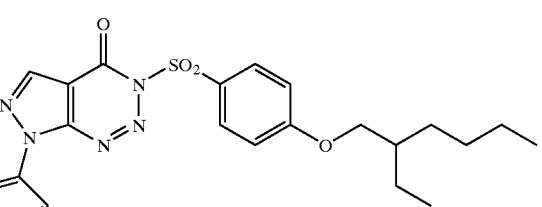
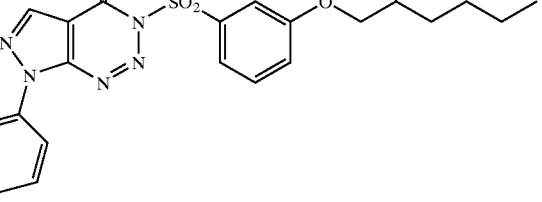

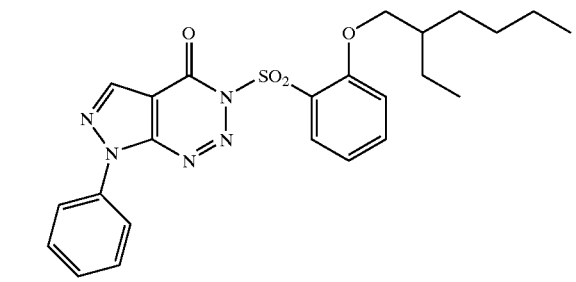
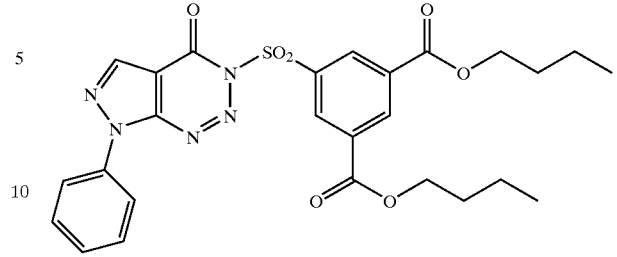
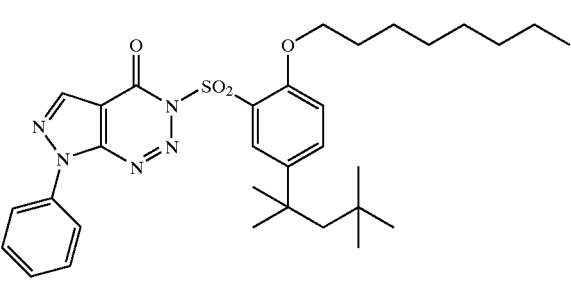
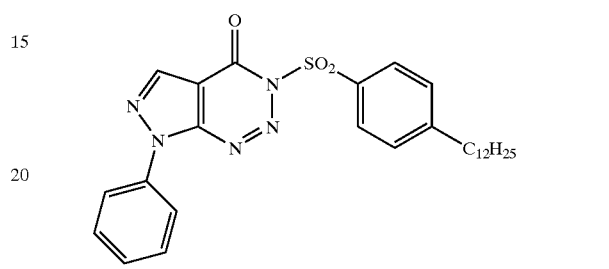
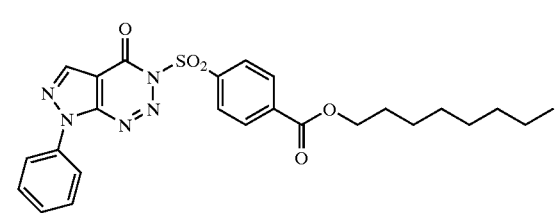
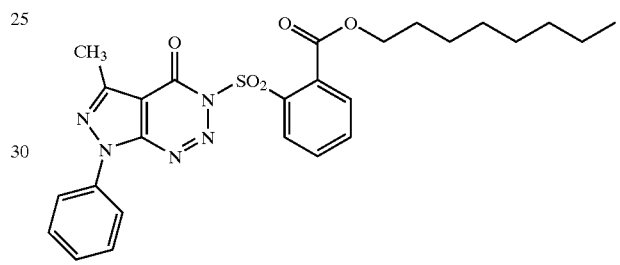
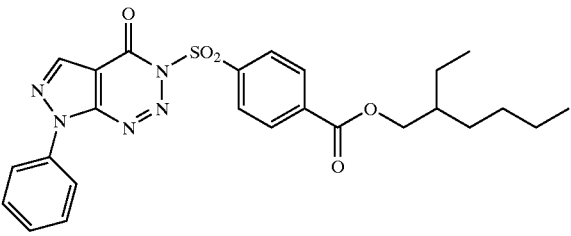
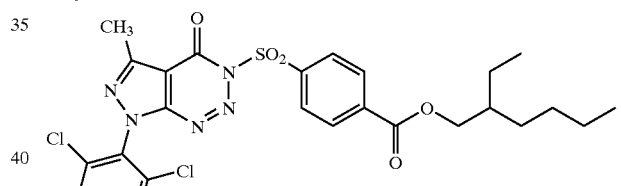
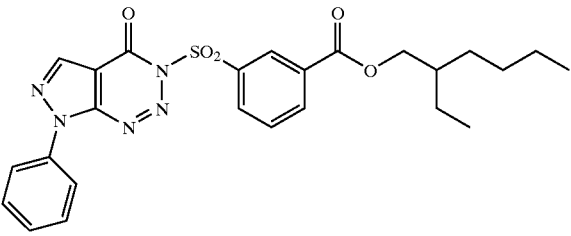
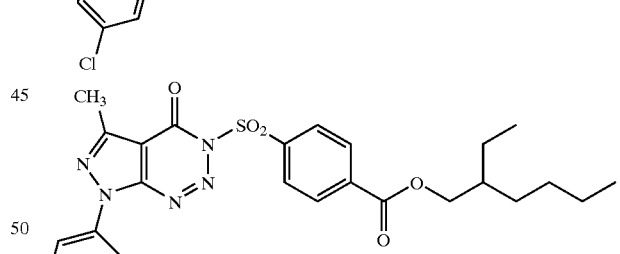
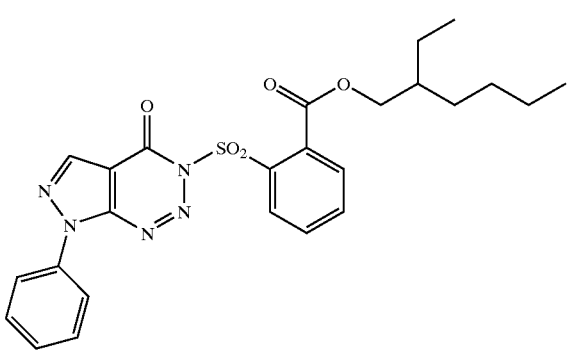
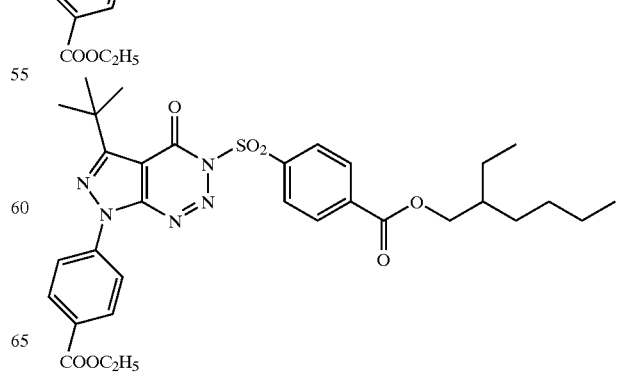

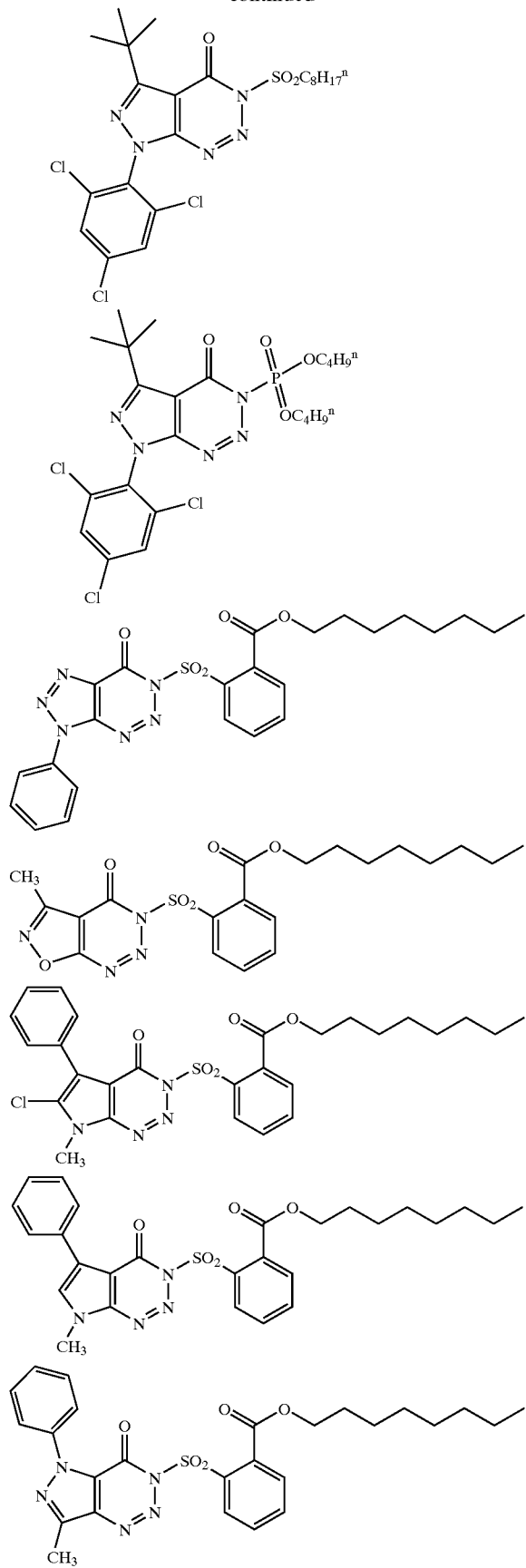
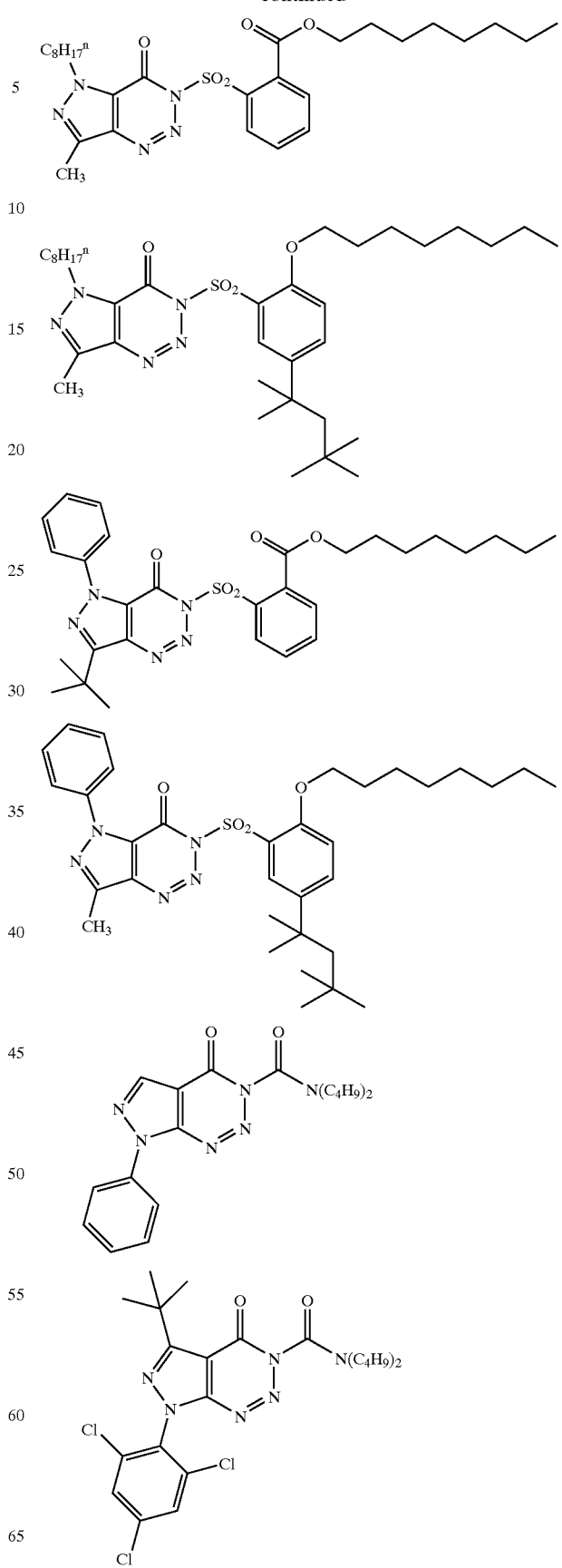

-continued
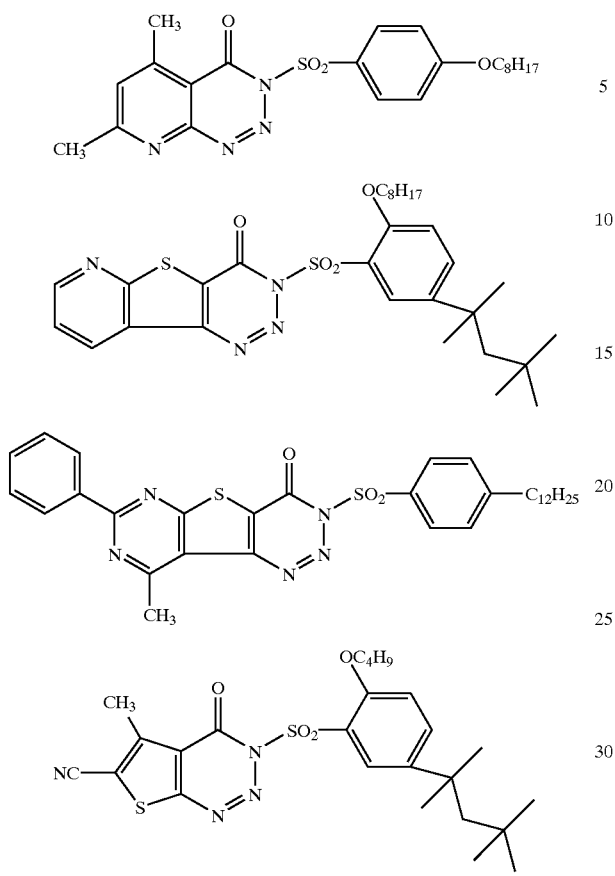
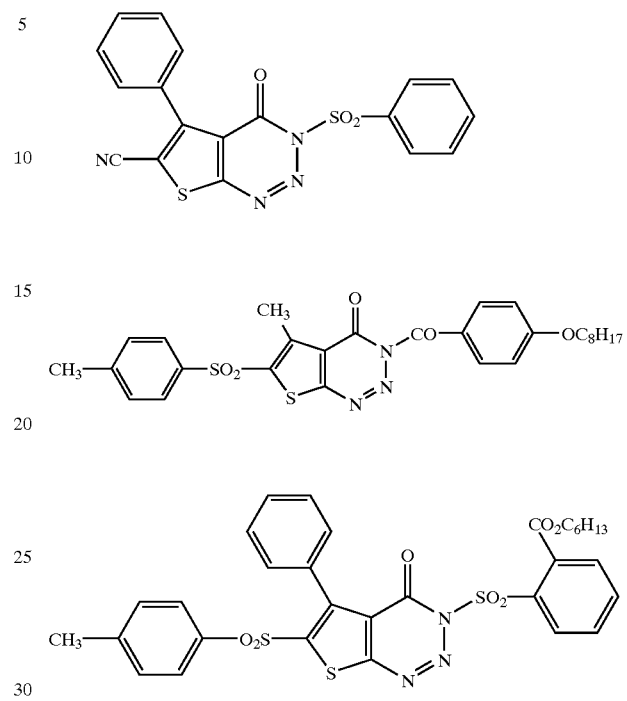
Other examples of the diazo compounds include those containing the following polymerizable groups.
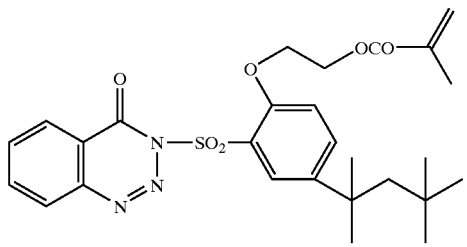
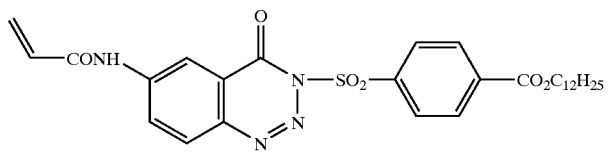
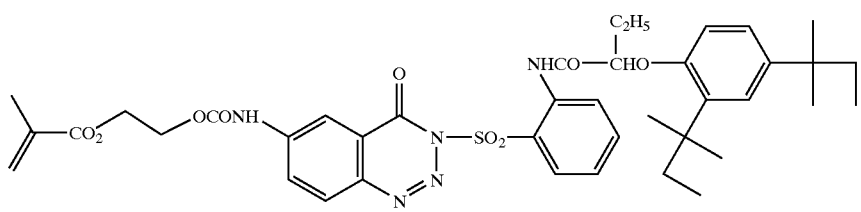

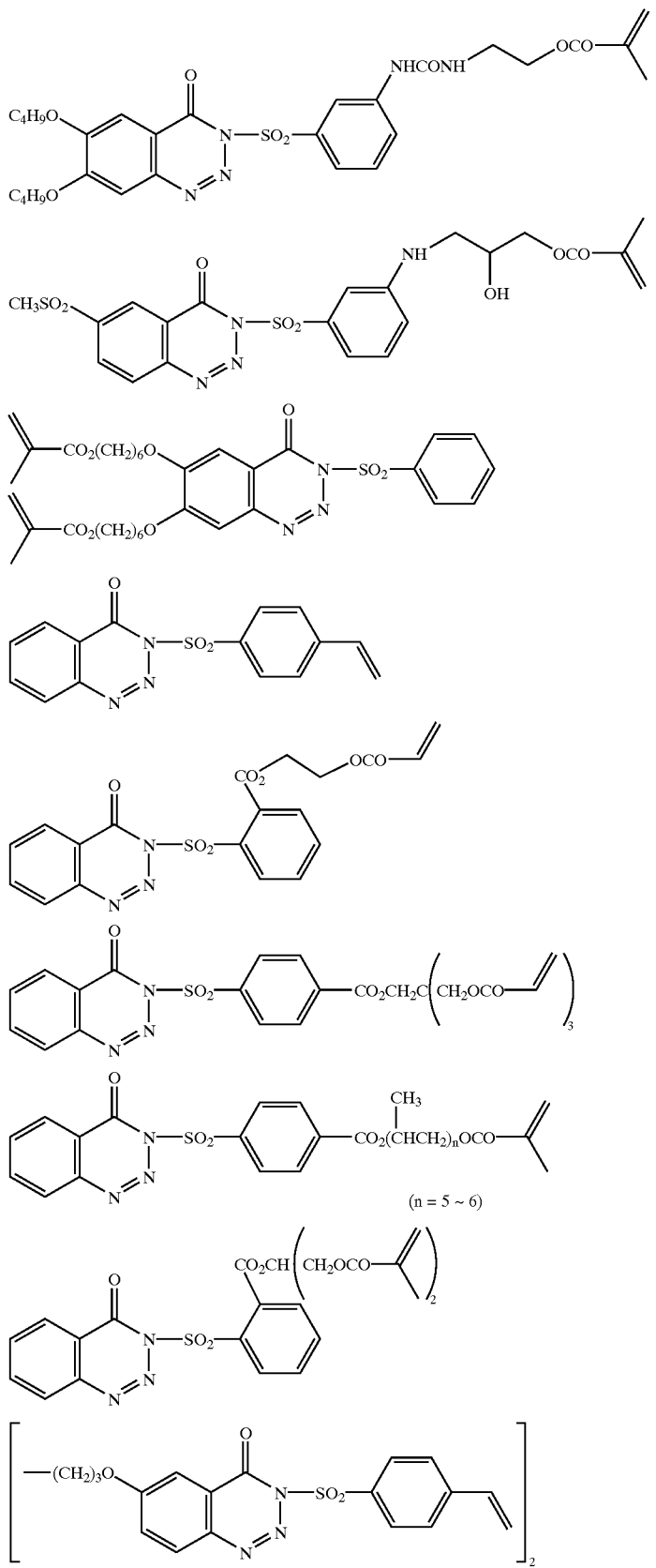

It is preferable from the standpoint of improvement of whiteness of the recording material that the diazo compound to be used in the present invention is nearly colorless or slightly yellowish. A maximum absorption wavelength of the above-described diazo compound is preferably 450 nm or less, and particularly preferably 400 nm or less.

However, even when the above-described diazo compound is slightly colored, it is possible that, after an image is formed on the recording material according to the present invention, the thus formed image is subjected to post-exposure to photodecompose an unreacted portion of the diazo compound thereby allowing the diazo compound to be colorless.

A content of the diazo compound is preferably from 0.01 g/m² to 5 g/m², and more preferably from 0.1 g/m² to 4 g/m².

Coupler Compound

Next, the coupler compound to be used in the recording material according to the present invention will be described below. The coupler compound either having a polymerizable group or having no polymerizable group therein can be used.

As the coupler compound, such known coupler compounds as used in silver halide photographic materials or diazo thermal recording materials can be used. Further, coupler compounds to become starting materials for dyes for thermal transfer materials or inkjet dyes can also be used. Examples of the coupler compounds include such compounds as represented by the following general formulas of from (C-1) to (C-12); generic names of these compounds are active methylene, pyrazolone, pyrazoloazole, phenol, naphthol, and pyrrolotriazole:

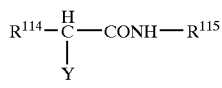  (C-1)

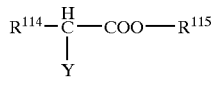  (C-2)

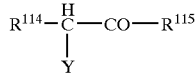  (C-3)

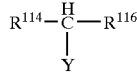  (C-4)

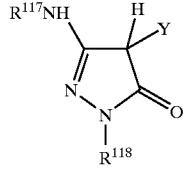  (C-5)

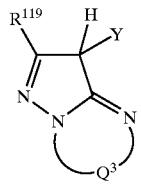  (C-6)

-continued

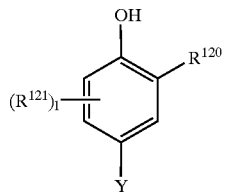  (C-7)

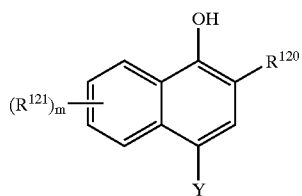  (C-8)

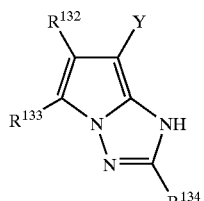  (C-9)

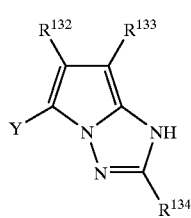  (C-10)

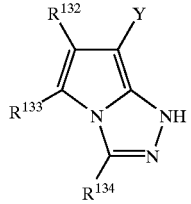  (C-11)

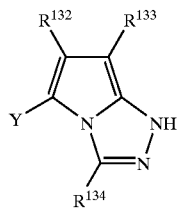  (C-12)

The general formulas of from (C-1) to (C-4) express couplers $R^{114}$ named as active methylenic couplers. In these formulas, $R^{114}$ represents any one of the following groups which may have a substituent therein: an acyl group, a cyano group, a nitro group, an aryl group, a heterocyclic residue, an alkoxycarbonyl group, an aryloxycarbonyl group, a carbamoyl group, a sulfamoyl group, an alkylsulfonyl group and an arylsulfonyl group.

In the general formulas of from (C-1) to (C-3), $R^{115}$ represents an alkyl group, an aryl group or a heterocyclic residue each of which may have a substituent. In the general formula (C-4), $R^{116}$ represents an aryl group or a heterocyclic residue each of which may contain a substituent. Examples of the substituents which $R^{114}$, $R^{115}$, and $R^{116}$ may contain include a halogen atom (for example, chlorine, or bromine), an alkyl group (for example, a methyl group, an ethyl group, an isopropyl group, an n-butyl group, or a t-butyl group), an aryl group (for example, a phenyl group, a tolyl group, or a xylyl goup), a heterocyclic residue (for example, a 2-pyridyl group, or an N-pyrrolidinyl group), a carbonamide group (for example, an acetylamino group, a propionylamino group, a butyroylamino group, or a benzoylamino group), a sulfonamide group (for example, a methane sulfonylamino group, an ethane sulfonylamino group, a benzene sulfonylamino group, or a toluene sulfonylamino group), an alkoxy group (for example, a methoxy group, or an ethoxy group), an aryloxy group (for example, a phenoxy group), an alkylthio group (for example, a methylthio group, an ethylthio group, or a butylthio group), an arylthio group (for example, a phenylthio group, or a tolylthio group), an amino group (an unsubstituted amino group, or a substituted amino group with a substituent being an aliphatic group, an aromatic group, or the like; for example, a methylamino group, or a phenylamino group), a carbamoyl group (a substitued carbamoyl group with a substituent being an aliphatic group, an aromatic group, a heterocyclic residue, or the like and a carbamoyl group in which a ring is formed by connecting nitrogen atoms with each other; for example, a methylcarbamoyl group, a dimethylcarbamoyl group, an ethylcarbamoyl group, a diethyl carbamoyl group, a dibutylcarbamoyl group, a peperidinocarbamoyl group, a morpholinocarbamoyl group, a phenylcarbamoyl group, a methylphenylcarbamoyl group, an ethylphenylcarbamoyl group, or a benzylphenylcarbamoyl group), a sulfamoyl group (a substitued sulfamoyl group with a substituent being an aliphatic group, an aromatic group, a heterocyclic residue, or the like and a sulfamoyl group in which a ring is formed by connecting nitrogen atoms with each other; for example, a methylsulfamoyl group, a dimethylsulfamoyl group, an ethylsulfamoyl group, a diethylsulfamoyl group, a dibutylsulfamoyl group, a piperidinosulfamoyl group, a morpholinosulfamoyl group, a phenylsulfamoyl group, a methylphenylsulfamoyl group, an ethylphenylsulfamoyl group, or a benzylphenylsulfamoyl group), a cyano group, a sulfonyl group (for example, a methane sulfonyl group, an ethane sulfonyl group, a phenylsulfonyl group, a 4-chlorophenylsulfonyl group, or a p-toluene sulfonyl group), an alkoxycarbonyl group (for example, a methoxycarbonyl group, an ethoxycarbonyl group, or a butoxycarbonyl group), an aryloxycarbonyl group (for example, a phenoxycarbonyl group), an acyl group (for example, an acetyl group, a propionyl group, a butyroyl group, a benzoyl group, or an alkylbenzoyl group), a ureide group (for example, a methylaminocarbonamide group, or a diethylaminocarbonamide group), a urethane group (for example, a methoxycarbonamide group, or a butoxycarbonamide group), an acyloxy group (for example, an acetyloxy group, a propionyloxy group, or a butyroyloxy group) and the like.

The above-described substituents may further contain other substituents. Such other substituents are the same as the above-described substituents. A number of carbon atoms of any one of the above-described substituents which may further contain another substituent is preferably from about 0 to about 36. Among other things, an alkyl group, an aryl group, a heterocyclic group, an alkoxy group, an aryloxy group, an alkylthio group, an arylthio group, an amino group, a carbonamide group, a ureide group, a urethane group, and a halogen atom are preferable.

In the general formulas of from (C-1) to (C-4), Y represents either a hydrogen atom or a group which is releasable by a coupling reaction with a diazo compound. Specific examples of Y include a hydrogen atom, a carboxyl group, a formyl group, a halogen atom, a carbamoyl group, a methylene group having a substituent (for example, an aryl group, a sulfonamide group, a carbonamide group, an alkoxy group, an amino group, or a hydroxyl group), an acyl group, a sulfo group, an alkoxy group, an aryloxy group, an alkylthio group, an arylthio group, an alkylsulfinyl group, an arylsulfinyl group, an alkylsulfonyl group, an arylsulfonyl group, an acyloxy group, an alkoxycarbonyloxy group, an aryloxycarbonyloxy group, a carbamoyloxy group, a sufamoyloxy group, and an N-substituted heterocyclic group. Among other things, a releasable group having a hydrogen atom, a halogen atom, an S atom, or an O atom as a releasable atom is particularly preferable.

Further, in the general formulas of from (C-1) to (C-4), each case of $R^{114}$ and $R^{115}$, and $R^{114}$ and $R^{116}$ may form a ring by bonding with each other in each case.

The general formula (C-5) expresses a coupler named as a 5-pyrazolone type coupler. In the formula, $R^{117}$ represents an alkyl group, an aryl group, an acyl group or a carbamoyl group. $R^{118}$ represents a phenyl group, or a phenyl group which is substituted with at least one atom or a group selected from the group consisting of a halogen atom, an alkyl group, a cyano group, an alkoxy group, an alkoxycarbonyl group and an acylamino group. Even in the 5-pyrazolone type coupler represented by the general formula (C-5), it is preferable that $R^{117}$ represents an aryl group or an acyl group while $R^{118}$ represents a phenyl group which is substituted with at least one halogen atom.

These preferable groups will now be described in detail below. $R^{117}$ represents an aryl group or an acetyl group, for example, a phenyl group, a 2-chlorophenyl group, a 2-methoxyphenyl group, a 2-chloro-5-tetradecanamidophenyl group, a 2-chloro-5-(3-octadecenyl-1-succinimido)phenyl group, a 2-chloro-5-octadecylsulfonamidophenyl group, or a 2-chloro-5-[2-(4-hydroxy-3-t-butylphenoxy)tetradecanamido]phenyl group, an acyl group, for example, 2-(2,4-di-t-pentylphenoxy) butanoyl group, a benzoyl group, or 3-(2,4-di-t-amylphenoxyacetamido)benzoyl group; on this occasion, these groups may further have another substituent that is an organic substituent which is connected via a carbon atom, an oxygen atom, a nitrogen atom or a sulfur atom, or a halogen atom. Y signifies the same as described above.

It is preferable that $R^{118}$ is a substituted phenyl group, for example, a 2,4,6-trichlorophenyl group, a 2,5-dichlorophenyl group, or a 2-chlorophenyl group.

The general formula (C-6) expresses a coupler named as a pyrazoloazole type coupler. In the formula, $R^{119}$ represents a hydrogen atom or a substituent. $Q^3$ represents a non-metallic atomic group which is necessary for forming a 5-membered azole ring having nitrogen atoms of from 2 to 4; on this occasion, such azole ring may have a substituent (inclusive of condenstion ring). Among the pyrazoloazole type couplers represented by the general formula (C-6), imidazo[1,2-b]pyrazoles described in U.S. Pat. No. 4,500,630, pyrazo[1,5-b]-1,2,4-triazoles described in U.S. Pat. No. 4,500,654, pyrazolo[5,1-c]-1,2,4-triazoles described in U.S. Pat. No. 3,725,067 are preferable from the standpoint of spectral absorption characteristics of color forming dyes.

Details of the substituent of the azole ring represented by the substituent $R^{119}$ or $Q^3$ are described, for example, in U.S. Pat. No. 4,540,654 (2nd column, 41st line to 8th column, 27th line). Preferable examples include: the pyrazoloazole coupler described in JP-A No. 61-65245, in which a branched alkyl group is directly connected at the 2-, 3- or 6-position of the pyrazolotriazole group; the pyrazoloazole coupler described in JP-A No. 61-65245, which has a sulfonamide group in a molecule; the pyrazoloazole coupler described in JP-A No. 61-147254, which has an alkoxyphenylsulfonamidoballast group; the pyrazolotriazole coupler described in JP-A No. 62-209457 and 63-307453, which has an alkoxy group or an aryloxy group at a 6-position thereof; and the pyrazolotriazole coupler described in Japanese Patent Application No. 1-22279, which has a carbonamide group in a molecule. Y signifies the same as described above.

The general formulas (C-7) and (C-8) are couplers named as a phenol type coupler and a naphthol type coupler, respectively. In the formulas, $R^{120}$ represents a hydrogen atom or a group selected from the group consisting of —$CONR^{122}R^{123}$, —$SO_2NR^{122}R^{123}$, —$NHCOR^{122}$, —$NHCONR^{122}R^{123}$, and —$NHSO_2NR^{122}R^{123}$: on this occasion, $R^{122}$ and $R^{123}$ each independently represent a hydrogen atom or a substituent. In the general formulas (C-7) and (C-8), $R^{121}$ represents a substituent, l represents an integer selected from 0 to 2 and m represents an integer selected from 0 to 4. When l and m are each independently 2 or more, a plurality of $R^{121}$ may differ from each other. As for substituents of from $R^{121}$ to $R^{123}$, mentioned are the same as the foregoing substituents exemplified as substituents which $R^{114}$, $R^{115}$, and $R^{116}$ may have. Y signifies the same as described above.

Preferable examples of the phenol couplers represented by the general formula (C-7) include those of a 2-acylamino-5-alkylphenol type described in U.S. Pat. Nos. 2,369,929, 2,801,171, 2,772,162, 2,895,826, 3,772,002, and the like, those of a 2,5-diacylaminophenol type described in U.S. Pat. Nos. 2,772,162, 3,758,308, 4,126,396, 4,334,011, and 4,327,173, GP-A No. 3,329,729, JP-A No. 59-166956, and the like, those of a 2-phenylureido-5-acylaminophenol type described in U.S. Pat. Nos. 3,446,622, 4,333,999, 4,451,559, 4,427,767, and the like. Y signifies the same as described above.

Preferable examples of the naphthol type couplers represented by the general formula (C-8) include those of a 2-carbamoyl-1-naphthol type described in U.S. Pat. Nos. 2,474,293, 4,052,212, 4,146,396, 4,282,233, 4,296,200, and the like, and those of a 2-carbamoyl-5-amido-1-naphthol type described in U.S. Pat. No. 4,690,889, and the like. Y signifies the same as described above.

The general formulas of from (C-9) to (C-12) are couplers named as pyrrolotriazole, in which $R^{132}$, $R^{133}$, and $R^{134}$ each independently represent a hydrogen atom or a substituent. Y signifies the same as described above. As for substituents of from $R^{132}$ to $R^{134}$, mentioned are the same as the foregoing substituents exemplified as substituents which $R^{114}$, $R^{115}$, and $R^{116}$ may have. Preferable examples of the pyrrolotriazole type couplers represented by the general formulas (C-9) to (C-12) include couples which are described in EP Nos. 488,248A1, 491,197A1 and 545,300 and in which at least one of $R^{132}$ and $R^{133}$ is an electron-attractive group. Y signifies the same as described above.

Further, such couplers as have a structure, for example, a condensation ring-based phenol, imidazole, pyrrole, 3-hydroxypyridine, an active methylene, an active methin, a 5,5-condensation ring-based heterocycle, or a 5,6-condensation ring-based heterocycle can also be used.

As for the condensation ring-based phenol type coupler, such couplers as described in U.S. Pat. Nos. 4,327,173, 4,564,586, 4,904,575, and the like can be used. As for the imidazole type coupler, such couplers as described in U.S. Pat. Nos. 4,818,672, 5,051,347, and the like can be used. As for the 3-hydroxypyridine type coupler, such a coupler as described in JP-A No. 1-315736 or the like can be used.

As for the active methylene and the active methylene type coupler, such couplers as described in U.S. Pat. Nos. 5,104,783, 5,162,196, and the like can be used. As for the 5,5-condensation ring-based heterocycle type coupler, a pyrrolopirazole type coupler described in U.S. Pat. No. 5,164,289 and a pyrroloimidazole type coupler described in JP-A No. 4-174429 can be used. As for the 5,6-condensation ring-based heterocycle type coupler, a pyrazolopyrimidine type coupler described in U.S. Pat. No. 4,950,585, a pyrrolotriazine type coupler described in JP-A No. 4-204730, a coupler described in EP No. 556,700, and the like can be used.

Examples of couplers other than those described above include couplers described in GP-A 3,819,051A, and 3,823,049, U.S. Pat. Nos. 4,840,883, 5,024,930, 5,051,347, and 4,481,268, EP Nos. 304,856A2, 329,036, 354,549A2, 374,781A2, 379,110A2 and 386,930A1, and JP-A Nos. 63-141055, 64-32260, 64-32261, 2-297547, 2-44340, 2-110555, 3-7938, 3-160440, 3-172839, 4-172447, 4-179949, 4-182645, 4-184437, 4-188138, 4-188139, 4-194847, 4-204532, 4-204731, and 4-204732.

Couplers further described in JP-A Nos. 2001-11330, 4-201483, 7-223367, 7-223368, 7-323660, 5-278608, 5-297024, 6-18669, 6-18670, 7-316280, 9-216468, 9-216469, 9-319025, 10-035113, 10-193801, and 10-264532 can also be used.

The coupler compound forms a dye by coupling with a diazo compound in a basic, an acidic and/or a neutral atmosphere, whereupon a plurality of couplers can simultaneously be used in accordance with various types of purposes such as a hue adjustment.

Specific examples of coupler compounds include such compounds as described in paragraphs of from 0060 to 0093 of JP-A No. 2001-63222, paragraphs of from 0035 to 0050 of JP-A No. 2001-11330, paragraphs of from 0053 to 0064 of JP-A No. 2000-239263, and the like.

When at least one of polymerizable compounds is one of the above-described coupler compounds, a polymerizable group can substitue the above-described coupler compound directly or via a divalent connecting group.

The polymerizable group may be any one of a radically polymerizable type, a cationically polymerizable type, and a photodimerizable type.

Among them, the radically polymerizable type is preferable in view of photopolymerization sensitivity. It is preferable that at least one of these polymerizable groups substitutes the above-described diazo compound per a molecule of the diazo compound. Examples of the polymerizable groups may further include a polymerizable portion described in paragraphs of from 0029 to 0044 of Japanese Patent Application No. 2000-142112 and parts thereof.

Examples of the divalent connecting groups which each connect the above-described coupler compound with the polymerizable group include such a divalent connecting group as described in paragraphs of from 0031 to 0032 of JP-A No. 10-142724, and the like.

Specific examples of couplers having a polymerizable group are shown below; however, the present invention is not limited thereto.

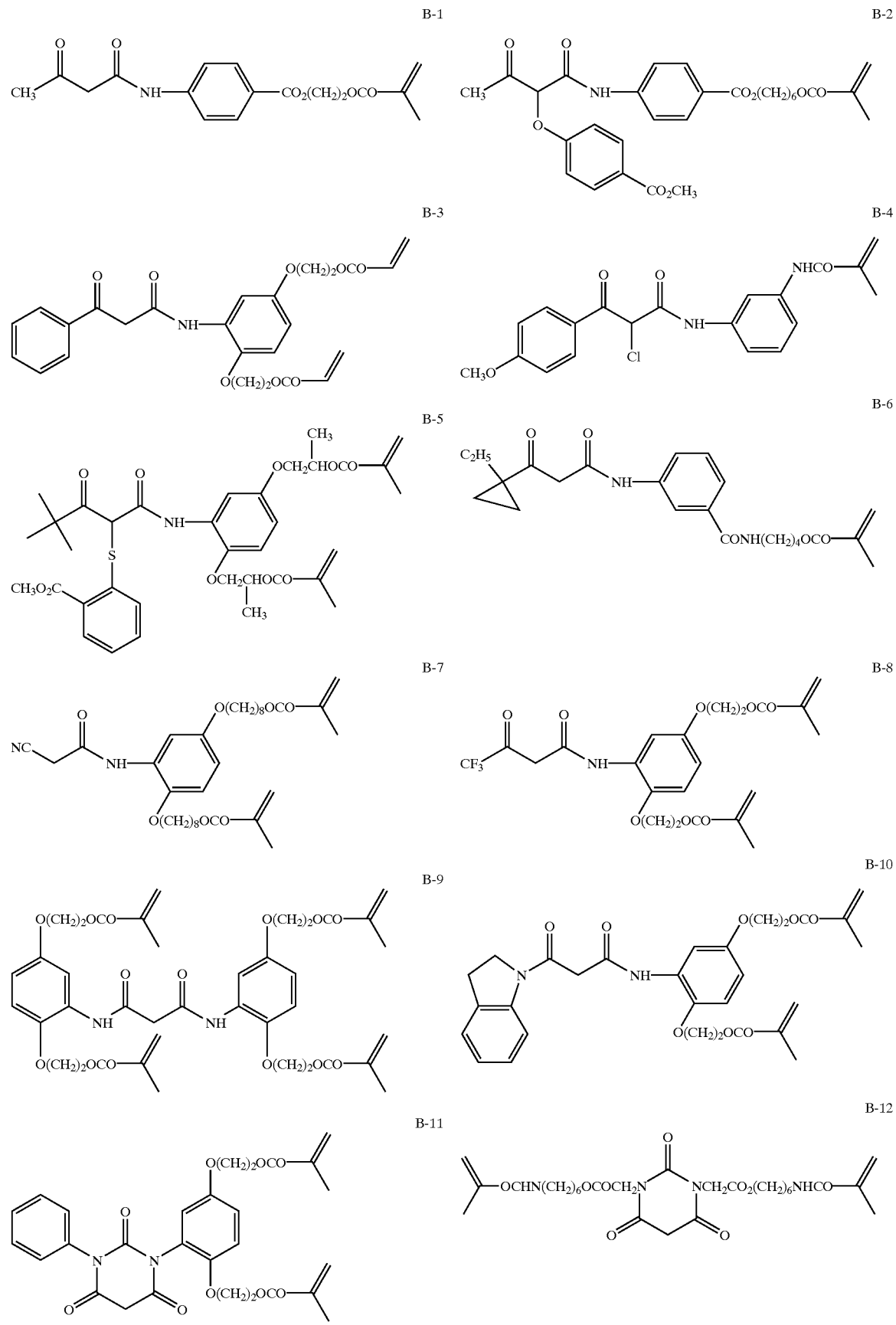

-continued
B-13
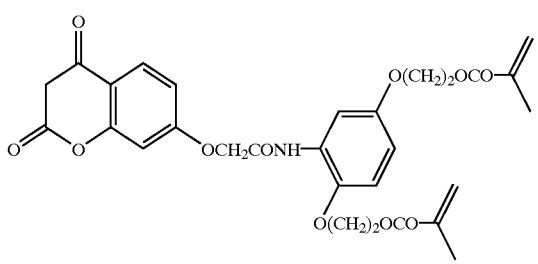
B-14
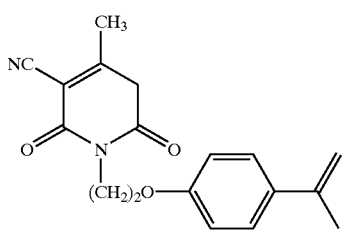
B-15
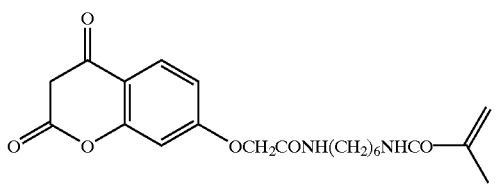
B-16
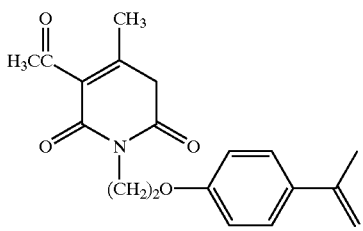
B-17
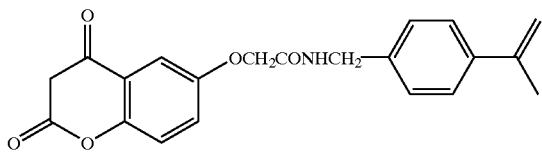
B-18
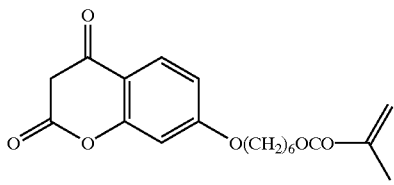
B-19
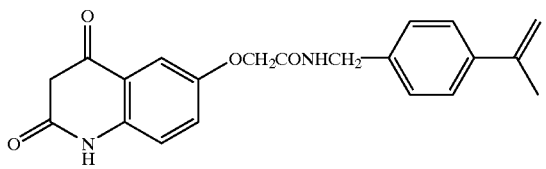
B-20
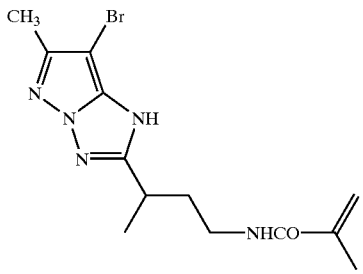
B-21
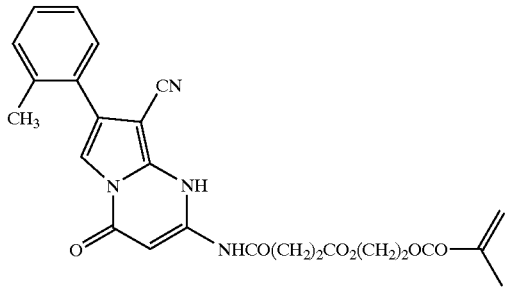
B-22
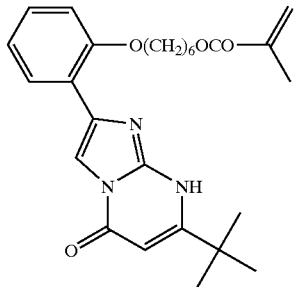
B-23
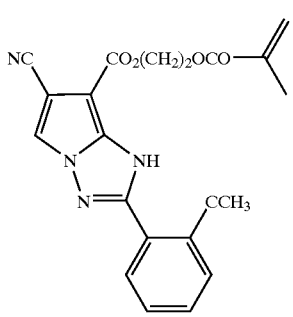

-continued
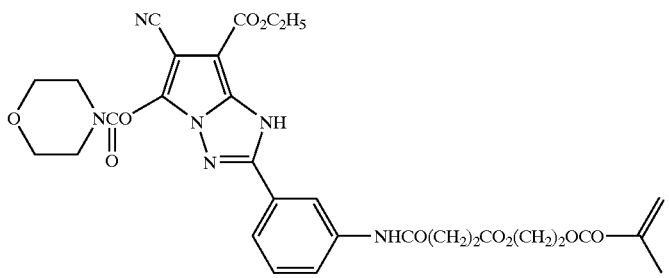
B-24
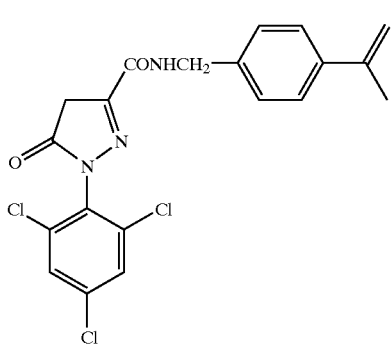
B-25
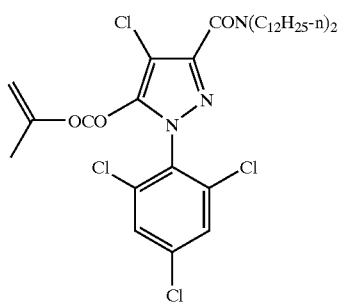
B-26
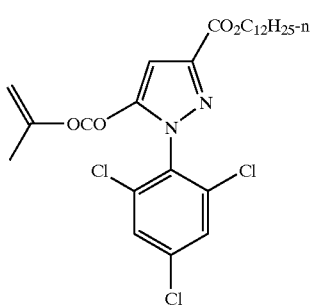
B-27
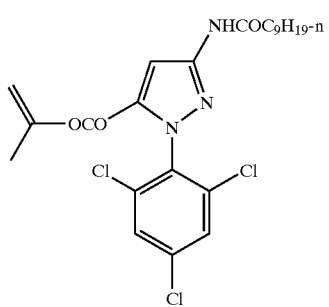
B-28
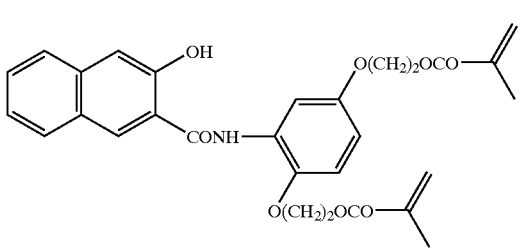
B-29
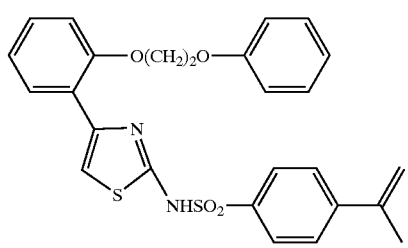
B-30
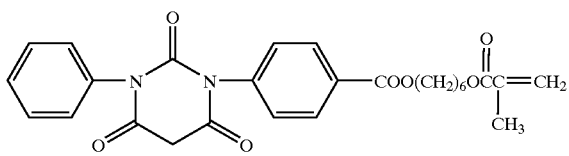
B-31
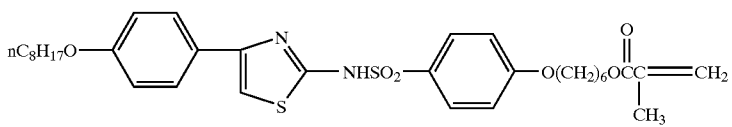
B-32

-continued
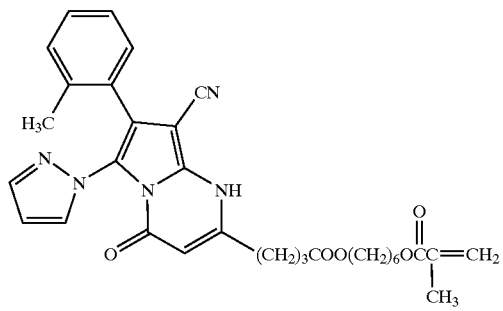
B-33
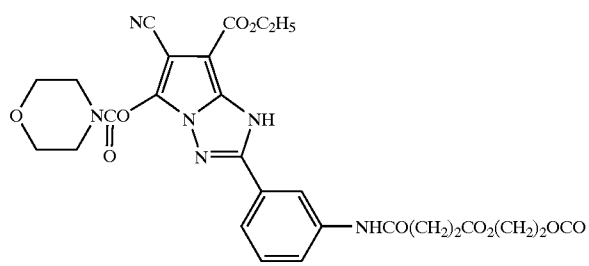
B-24
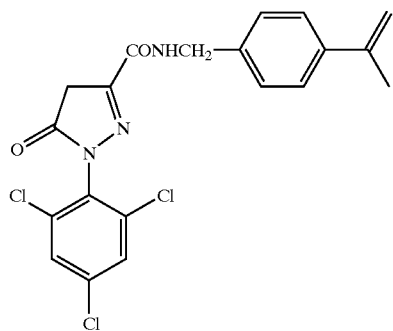
B-25
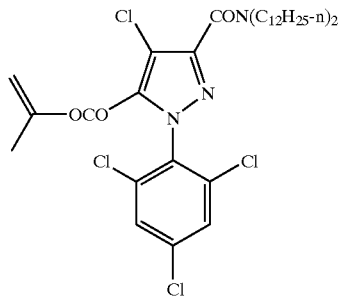
B-26
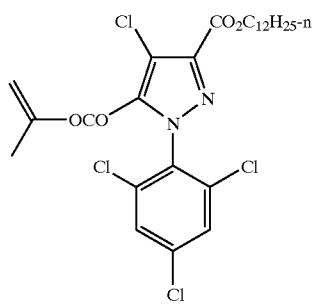
B-27

-continued
B-28

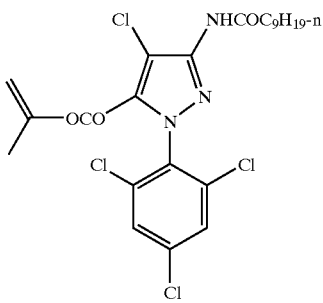

A quantity of the coupler compound to be used is not particularly limited; however, it is preferable that the coupler compound is used in a range of from 0.1 mole to 20 moles relative to one mole of the diazo compound.

Polymerizable Compound

Further, the polymerizable compound according to the present invention is a compound which has a polymerizable group having at least one functionality.

The above-described diazo compound having the polymerizable group and the coupler compound having the polymerizable group are also included in the above-described polymerizable compounds.

The above-described polymerizable compound that is preferably a polymerizable compound which has at least one ethylenically unsaturated double bond in a molecule is not particularly limited and can appropriately be selected in accordance with purposes; on this occasion, examples of the polymerizable compounds include acrylic acid esters, acrylic acid derivatives such as acrylamides, acrylic acid and a salt thereof, methacrylic acid esters, methacrylic acid derivatives such as methacrylamides, methacrylic acid and a salt thereof, maleic anhydride, maleic acid esters, itaconic acid, itaconic acid esters, styrene, vinyl ethers, vinyl esters, N-vinyl heterocycles, allyl ethers, and allyl esters.

The above-described polymerizable compound has at least one olefinic double bond therein and may be any one of a low-molecular weight type (monomer type) and a high molecular weight type (oligomer type).

Examples of monomers having a double bond include alkyl (or hydroxyalkyl) acrylate (methacrylate) such as methyl acrylate, ethyl acrylate, butyl acrylate, 2-ethylhexyl acrylate, 2-hydroxyethyl acrylate, isobornyl acrylate, methyl methacrylate, and ethyl methacrylate. Silicon acrylate is also advantageously included.

Other examples than those described above include acrylonitrile, acrylamide, methacrylamide, N-substituted (meth)acrylamide, a vinyl ester such as vinyl acetate, a vinyl ether such as isobutyl vinyl ether, styrene, an alkyl- and halo-styrene, N-vinyl pyrrolidone, vinyl chloride, and vinylidene chloride.

Examples of monomers having at least two or more double bonds include diacrylates of, for example, ethylene glycol, propylene glycol, neopentyl glycol, hexamethylene glycol, and bisphenol-A, 4,4'-bis(2-acryloyloxyethoxy) diphenyl propane, trimethylolpropane triacrylate, pentaerythritol triacrylate (or tetracrylate), vinyl acrylate, divinylbenzene, divinyl succinate, diallyl phthalate, triallyl phosphate, triallyl isocyanurate, and tris(2-acryloylethyl) isocyanulate.

Examples of multi-unsaturated compounds of a relatively high molecular weight type (oligomer type) include an epoxy resin having a (meth)acrylic group, a polyester having a (meth)acrylic group, a polyester containing a vinyl ether or an epoxy group, polyurethane, and a polyether. Further, examples of unsaturated oligomers include an unsaturated polyester resin which is ordinarily produced by maleic acid, phthalic acid and at least one type of diols and has a molecular weight of from about 500 to 3000. Furthermore, a vinyl ether monomer and an oligomer thereof, and an oligomer which has a polyester, polyurethane, a polyether, polyvinyl ether or epoxy as a main chain and is terminated with a maleate can also be used. Particularly preferable is a combination of an oligomer having a vinyl ether group and a polymer described in WO 90/01512. Further, also preferable are a copolymer of a vinyl ether and a monomer functionalized with maleic acid. The unsaturated oligomer of this type can belong to a category of prepolymers.

Particularly preferable examples thereof include esters of ethylenically unsaturated carboxylic acids and polyols or polyepoxides, polymers each having an ethylenically unsaturated group in a main or side chain, for example, unsaturated polyesters, polyamides, polyurethanes and copolymers thereof, alkyd resins, polybutadiene and butadiene copolymers, polyisoprene and isoprene copolymers, polymers having a (meth)acylic group in a side chain thereof and copolymers thereof, and mixtures of at least any two of the above-described polymers.

Examples of unsaturated carboxylic acids include acrylic acid, methacrylic acid, crotonic acid, itaconic acid, cinnamic acid, unsaturated fatty acids such as linoleic acid, and oleic acid. Among these acids, acrylic acid and methacrylic acid are preferable.

Preferable polyols are aromatic and, particularly, aliphatic and cycloaliphatic polyols. Examples of aromatic polyols include hydroquinone, 4,4'-dihydroxydiphenyl, 2,2-di(4-hydroxyphenyl)propane, novolak and resorcin. Examples of polyepoxides include the above-described polyols, particularly, those based on aromatic polyols and epichlorohydrin. Examples of other preferable polyols include polymers each containing a hydroxyl group in a polymer chain or side chain and copolymers thereof, for example, polyvinyl alcohol and copolymers thereof, polyhydroxyalkylmethacrylate and copolymers thereof. Examples of still other preferable polyols include oligoesters having a terminal hydroxyl group.

Examples of aliphatic and cycloaliphatic polyols include an alkylene diols, preferably, each having from 2 to 12 carbon atoms, for example, ethylene glycol, 1,2- or 1,3-propanediol, 1,2-, 1,3- or 1,4-butanediol, pentanediol, hexanediol, octanediol, dodecanediol, diethylene glycol and triethylene glycol, polyethylene glycol, preferably, having a molecular weight of from 200 to 1500, 1,3-cyclopentanediol, 1,2-, 1,3- or 1,4-cyclohexanediol, 1,4- dihydroxymethylcyclohexane, glycerol, tris(β-hydroxyethyl)amine, trimethylolethane, trimethylolpropane, pentaerythritol, dipentaerythritol, and sorbitol.

Polyols can be esterified either partially or completely by one type of carboxylic acid or different types of unsaturated carboxylic acid and, in such partial esterification, a free hydroxyl group can be modified, for example, can be either etherified or esterified by another carboxylic acid.

Examples of esters include trimethylolpropane triacrylate, trimethylolethane triacrylate, trimethylolpropane trimethacrylate, trimethylolethane trimethacrylate, tetramethylene glycol dimethacrylate, triethylene glycol dimethacrylate, tetraethylene glycol diacrylate, pentaerythritol diacrylate, pentaerythritol triacrylate, pentaerythritol tetraacrylate, dipentaerythritol diacrylate, dipentaerythritol triacrylate, dipentaerythritol tetraacrylate, dipentaerythritol pentacrylate, dipentaerythritol hexacrylate, tripentaerythritol octacylate, pentaerythritol dimethacrylate, pentaerythritol trimethacrylate, dipentaerythritol dimethacrylate, dipentaerythritol tetramethacrylate, tripentaerythritol octamethacrylate, pentaerythritol diitaconate, dipentaerythritol trisitaconate, dipentaerythritol pentaitaconate, dipentaerythritol hexaitaconate, ethylene glycol diacrylate, 1,3-butanediol diacrylate, 1,3-butanediol dimethacrylate, 1,4-butanediol diitaconate, sorbitol triacrylate, sorbitol tetraacrylate, pentaerythritol-modified triacrylate, sorbitol tetramethacrylate, sorbitol pentaacrylate, sorbitol hexaacrylate, oligoester acrylate or methacrylate, glycelol diacrylate or triacrylate, 1,4-cyclohexane diacrylate, bisacrylate or bismethacrylate of polyethylene glycol having a molecular weight of from 200 to 1500 and mixtures thereof.

Preferable examples of the above-described polymerizable compounds include amides of same or different unsaturated carboxylic acids and an aromatic, cycloaliphatic or aliphatic polyamine having amino groups of preferably from 2 to 6, particularly from 2 to 4.

Examples of such polyamines include ethylene diamine, 1,2- or 1,3-propylene diamine, 1,2-, 1,3- or 1,4-butylene diamine, 1,5-pentylene diamine, 1,6-hexylene diamine, octylene diamine, dodecylene diamine, 1,4-diaminocyclohexane, isophorone diamine, phenylene diamine, bisphenylene diamine, di-β-aminoethy ether, diethylene triamine, triethylene tetramine, di(β-aminoethoxy)- or di(β-aminopropoxy)ethane. As other examples thereof, polymers, preferably having a further amino group in a side chain thereof and coplymers thereof, and oligoamides having a terminal amino group are favorable. Examples of such unsaturated amides include methylenebisacrylamide, 1,6-hexamethylenebisacrylamide, diethylenetriaminetrismethacrylamide, bis(methacrylamidopropoxy)ethane, β-methacrylamidoethylmethacrylate, and N-[(β-hydroxyethoxy)ethyl]acrylamide.

A preferable unsaturated polyester and polyamides are derived from maleic acid and a diol or a diamine. Some of a plurality of maleic acid can be replaced by other dicarboxylic acid and these can be used together with an ethylenically unsaturated comonomer, such as styrene. The polyesters and polyamides can be derived from dicarboxylic acid and from an ethylenically unsaturated diol or diamine which, particularly, have a relatively long chain, for example, of from 6 to 20 carbon atoms. Examples of polyurethane include such polyurethane as is constituted by a saturated or unsaturated diisocyanate, and unsaturated or respectively saturated diols.

Polybutadiene, polyisoprene and copolymers thereof are well known in the art. Preferable examples of comonomers include olefins, such as, ethylene, propene, butene and hexene, (meth)acylate, acrylonitrile, styrene and vinyl chloride. Polymers having a (meth)acrylate group in a side chain thereof are also well known in the art. For example, they can be a reaction product between a novolak-based epoxy resin and (meth)acrylic acid, a homopolymer or copolymer of vinyl alcohol or a hydroxyalkyl derivative thereof prepared by being esterified by (meth)acrylic acid, or a homopolymer or copolymer of (meth)acrylate which has been esterified by hydroxyalkyl(meth)acrylate.

A content of the above-described polymerizable compound is ordinarily from 5% by mass to 95% by mass, and preferably from 10% by mass to 90% by mass on the basis of the total solid content in the recording layer.

Other Components

Basic Substances

For the purpose of promoting a coupling reaction between a diazo compound and a coupler, organic bases such as tertiary amines, piperidines, piperazines, amidines, formamidines, pyridines, guanidines, and morpholines can be used.

Examples of such organic bases include piperazines such as N,N'-bis(3-phenoxy-2-hydroxypropyl)piperazine, N,N'-bis[3-(p-methylphenoxy)-2-hydroxypropyl]piperazine, N,N'-bis[3-(p-methoxyphenoxy)-2-hydroxypropyl]piperazine, N,N'-bis(3-phenylthio-2-hydroxypropyl)piperazine, N,N'-bis[3-(β-naphthoxy)-2-hydroxypropyl]piperazine, N-3-(β-naphthoxy)-2-hydroxypropyl-N'-methylpiperazine, and 1,4-bis{[3-(N-methylpiperazino)-2-hydroxy]propyloxy}benzene, morpholines such as N-[3-(β-naphthoxy)-2-hydroxyl]propylmorpholine, 1,4-bis[(3-morpholino-2-hydroxy)propyloxy]benzene, and 1,3-bis[(3-morpholino-2-hydroxy)propyloxy]benxene, piperidines such as N-(3-phenoxy-2-hydroxypropyl)piperidine, and N-dodecylpiperidine, triphenyl guanidine, tricyclohexyl guanidine, dicyclohexyl phenyl guanidine, 4-hydroxybenzoic acid 2-N-methyl-N-benzylaminoethyl ester, 4-hydroxybenzoic acid 2-N,N-di-n-butylaminoethyl ester, 4-(3-N,N-dibutylaminopropoxy)benzene sulfonamide, 4-(2-N,N-dibutylaminoethoxycarbonyl)phenoxyacetic acid amide and the like.

These organic bases may be used either each independently or in a mixture of at least two types thereof.

These organic bases are described in JP-A Nos. 57-123086, 60-49991 and 60-94381, Japanese Patent Application Nos. 7-228731, 7-235157 and 7-235158, and the like.

In a case in which the above-described organic bases can be used, an organic base having a polymerizable group may also be used as an organic base.

When the organic base having a polymerizable group is used in the above-described recording material, a diazo compound which is a color forming component can be microencapsulated together with a coupler, and the organic base having a polymerizable group is allowed to function as a color forming component. When the diazo compound which is a color forming component and the coupler are microencapsulated, the diazo compound and the coupler are used in a combination such that a color forming reaction does not occur when the base is absent.

Further, in the above-described recording material, when the diazo compound and the coupler having a polymerizable group as a coupler compound are used, an organic base having a polymerizable group can be used together with the diazo compound and the coupler.

A quantity of the above-described organic base to be used is not particularly limited; however, it is preferable that the organic base is used in a range of from 0.01 mole to 30 moles based on 1 mole of the diazo compound.

Further, other than the above-described organic bases, a color forming aid can be added in the recording layer for the purpose of promoting the color forming reaction, that is, performing thermal printing in a rapid complete manner with a lower energy consumption. The term "color forming aid" as used herein includes any substance which enhances color density at the time of thermal recording or controls a color forming temperature, and is used for creating conditions which facilitate a reaction between the diazo compound and the coupler by reducing respective melting points of the coupler, basic substance, diazo compound or the like or by means of a thermoplasticizer of the microcapsule which has a function of reducing the softening point of the capsule wall.

The substance which decreases the melting point is solid under a normal condition, is melted by heat at a melting point of from 50° C. to 150° C. and is capable of dissolve the diazo compound, the coupler, the organic base or the like. Specific examples of the substances include carboxylic acid amides, N-substituted carboxylic acid amides, ketone compounds, urea compounds, esters, and ethers.

An effective compound as the thermoplasticizer of the microcapsule is a compound having a substituent which can interact with a compound that constitutes the microcapsule to change material permeability of the microcapsule at the time of heating.

Types of such interactions include hydrogen bonding, an electrostatic interaction, a hydrophobic interaction and the like. Particularly, a compound having a substituent which can form a hydrogen bond with the compound that constitutes the microcapsule is preferable.

Examples of the substituents which can form the hydrogen bond include a hydroxy group, a carbamoyl group, a sufamoyl group, an ether bond, an ester bond, and an amino group.

As the thermoplasticizer, mentioned are phenol derivatives, naphthol derivatives, alkoxy-substituted benzene derivatives, alkoxy-substituted naphthalene derivatives, benzene sulfonamide derivatives, carbamoyla-lkyloxybenzene derivatives and the like.

Specific examples of the thermoplasticizers include compounds described in paragraphs of from 0013 to 0014 of JP-A No. 9-39389, paragraphs of from 0026 to 0035 of JP-A No. 9-71048, paragraphs of from 0026 to 0034 of JP-A No. 9-77729, paragraphs of from 0026 to 0034 of JP-A No. 9-77737, a hydroxy compound, a carbamic acid ester compound, an aromatic methoxy compound, an organosulfonamide compound, and an aryl sulfonamide compound, described in JP-B No. 6-55546, which may be added for the purpose of enhancing a thermal color forming property, an aryl amide compound described in JP-B No. 6-57470, an aliphatic amide compound described in JP-A No. 62-144990, an aromatic ether, an ester, alcohols, phenols, sulfonamides, and acid amides described in JP-A No. 62-146675, an aromatic ether, and an ester described in JP-A No. 62-146676, compounds represented by the general formulas of from [1-1] to [1-3] described in JP-B No. 5-68357, a thiohydroquinone compound described in JP-A 62-187080, and an aliphatic amide compound described in JP-B No. 6-45260.

When at least one of the polymerizable compounds is the above-described thermoplasticizer, the polymerizable group can substitute the thermoplasticizer either directly or via a divalent connecting group.

The polymerizable group may be any one of a radically polymerizable type, a cationically polymerizable type and a photodimerizable type.

Among them, the radically polymerizable type is preferable in view of photopolymerization sensitivity. It is preferable that at least one of these polymerizable groups substitute the above-described thermoplasticizer per a molecule of the thermoplasticizer. Examples of the polymerizable groups may further include a polymerizable portion as shown in paragraphs of from 0029 to 0044 of Japanese Patent Application No. 2000-142112 or a part thereof.

Examples of the divalent connecting groups which each connect the above-described thermoplasticizer with the polymerizable group include such a divalent connecting group as shown in paragraphs of from 0031 to 0032 of JP-A No. 10-142724.

Specific examples of the polymerizable thermoplasticizers include a phenol compound having a polymerizable group described in JP-A No. 4-71896, a hydroxybenzene sulfon derivative having a polymerizable group described in JP-A No. 5-92951, a polymerizable phenol derivative described in JP-A No. 5-163207, a phenol derivative having a polymerizable group described in JP-A No. 5-178815, and a phenol derivative having a polymerizable group described in JP-A 5-294058 and, further, include compounds described below.

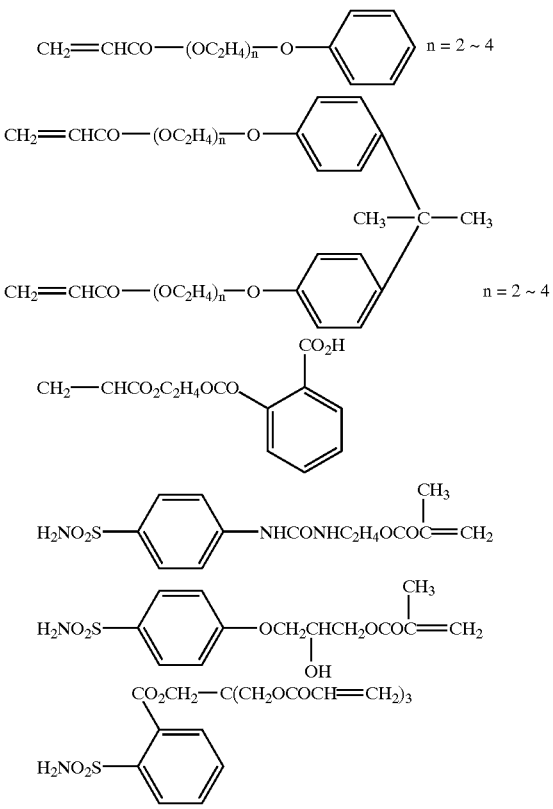

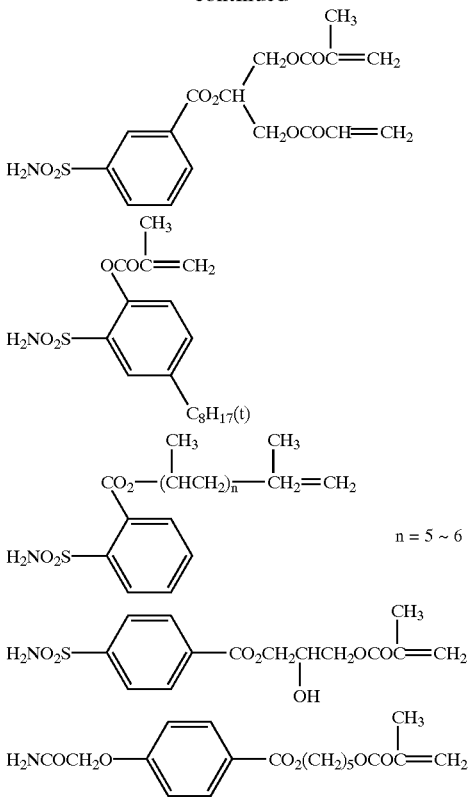

A quantity of the thermoplasticizer of the microcapsule to be used is not particularly limited; however, it is preferably from 0.01 g/m² to 20 g/m², and particularly preferably from 0.1 g/m² to 10 g/m².

Dyes

It is preferable that the recording layer according to the present invention is added with a dye, particularly a spectral sensitizing dye having a maximum absorption wavelength of from 300 to 1000 nm, to enhance photopolymerization sensitivity thereof. A radical generating agent described below aims for generating a radical in a high efficient manner to enhance sensitivity for the purpose of effectively corresponding to light having the above-described spectral absorption wavelength range.

As for the above-described spectral sensitizing dye, a spectral sensitizing dye having a maximum abosorption wavelength in the above-described wavelength range can optionally be selected such that the spectral sensitizing dye can be adapted to an exposure light source to be used. As for the exposure light source, any one of blue-color, green-color, red-color, infrared semiconductor lasers, an LED and the like can be used.

Therefore, for example, when a color image is formed from a multi-color recording material in which recording layers that each independently form a color in a different hue are laminated one on another, spectral sensitizing dyes having different maximum absorption wavelengths from one another are allowed to be present in respective recording layers. On this occasion, highly sensitive and highly sharp color forming ranges are formed in specified regions in respective layers by using light sources adapted to respective absorption wavelengths whereupon an excellent color image can be produced even when a multi-layer recording material is used.

Further, when the spectral sensitizing dye is decolored for the purpose of enhancing whiteness of the recording material, it is possible to perform such decoloration by a radical generated by light irradiation or heating, a base or a nucleophilic agent.

As for the spectral sensitizing dye, a cationic dye, a neutral dye and an anionic dye which are well known in the art can be used.

Specific examples of the above-described spectral sensitizing dyes include those described in "Research Disclosure", item 20036, vol. 200, December 1980; "Sensitizer" edited by Katsumi Tokumaru and Makoto Okawara, pp. 160–163, Kodansha Ltd., 1987; and the like.

Specifically, mentioned are a 3-ketocoumarin compound described in JP-A No. 58-15603, a thiopyrylium salt described in JP-A No. 58-40302, a naphthothiazole merocyanine compound described in JP-B Nos. 59-28328 and 60-53300, a merocyanine compound described in JP-B Nos. 61-9621 and 62-3842, JP-A Nos. 59-89303 and 60-60104.

Further, mentioned are dyes described in "Chemistry of Functional Dyes", pp. 393–416, CMC Press, 1981, "Color Material", 60[4]212–224, 1987 and the like; on this occasion, specifically mentioned are a cationic methine dye, a cationic carbonium dye, a cationic quinonimine dye, a cationic indoline dye, and a cationic styryl dye.

Examples of the above-described spectral sensitizing dyes include keto dyes such as a coumarin (inclusive of ketocoumarin or sulfocoumarin) dye, a merostyryl dye, an oxonol dye, and a hemioxonol dye, non-keto dyes such as a non-ketopolymethine dye, a triarylmethane dye, a xanthene dye, an anthracene dye, a rhodamine dye, an acridine dye, an aniline dye, and an azo dye, non-ketopolymethine dyes such as an azomethine dye, a cyanine dye, a carbocyanine dye, a dicarbocyanine dye, a tricarbocyanine dye, and a hemicyanine dye, a styryl dye, quinonimine dyes such as an azine dye, an oxazine dye, a thiazine dye, a quinoline dye, a thiazole dye, and the like.

By appropriately using the above-described spectral sensitizing dyes, the spectral sensitivity of the photopolymerization initiator to be used in the recording layer according to the present invention can be obtained in a range of from ultraviolet to infrared.

The various types of the spectral sensitizing dyes described above can be used either each independently or in mixtures of at least two types thereof.

A quantity of the spectral sensitizing dye to be used is, based on 1 part by mass of the radical generating agent to be described below, preferably from 0.01 part by mass to 5 parts by mass, and more preferably from 0.05 part by mass to 2 parts by mass.

Radical Generating Agent

It is preferable that a radical generating agent which generates a radical by interacting with the above-described spectral sensitizing dye is contained in a recording layer according to the present invention. The radical generating agent sensitively corresponds to light in a range of a spectral abosorption wavelength of the above-described spectral sensitizing dye by being present simultaneously with such spectral sensitizing dye to generate radicals in a high efficient manner whereupon the radical generating agent can aim for high sensitivity and control generation of the radical by using an optional light source in a range of from visible light to infrared light.

As for the above-described radical generating agents, at least one type can be selected from radical generating agents which can initiate polymerization of a polymerizable compound contained in the recording layer to be used.

Examples of the above-described radical generating agents include aromatic ketones, for example, benzophenone, camphorquinone, 4,4-bis(dimethyamino) benzophenone, 4-methoxy-4'-dimethylaminobenzophenone, 4,4'-dimethoxybenzophenone, 4-dimethylaminobenzophenone, 4-dimethylaminoacetophenone, benzylanthraquinone, 2-tert-butylanthraquinone, 2-methylanthraquinone, xanthone, thioxanthone, 2-chlorothioxanthone, 2,4-diethylthioxanthone, fluorenone, acridone, bisacylphosphine oxides such as bis(2,4,6-trimethylbenzoyl)-phenylphosphine oxide, acylphosphine oxides such as Lucirin TPO, α-hydroxy- or α-amino-acetophenones, α-hydroxycycloalkylphenylketones, and dialkoxyacetophenones; benzoin- and benzoin ethers such as benzoin methyl ether, benzoin ethyl ether, and benzoin isopropyl ether, benzoin phenyl ether; 2,4,5-triarylimidazole dimers such as a 2-(o-chlorophenyl) -4,5-diphenylimidazole dimer, a 2-(o-chlorophenyl)-4,5-di(m-methoxyphenyl)imidazole dimer, a 2-(o-fluorophenyl)-4,5-diphenylimidazole dimer, a 2-(o-methoxyphenyl)-4,5-diphenylimidazole dimer, a 2-(p-methoxyphenyl)-4, and 5-diphenylimidazole dimer; further, compounds described in U.S. Pat. Nos. 3,784,557, 4,252, 887, 4,311,783, 4,459,349, 4,410,621, 4,622,286 and the like; polyhalogen compounds such as carbon tetrabromide, phenyltribromomethylsulfon, and phenyltrichloromethyl ketone; compounds described in JP-A No. 59-133428, JP-B Nos. 57-1819 and 57-6096, and U.S. Pat. No. 3,615,455; S-triazine derivatives having a trihalogen-substituted methyl group, which are described in JP-A No. 58-29803, such as 2,4,6-tris(trichloromethyl)-S-triazine, 2-methoxy-4,6-bis (trichloromethyl)-S-triazine, 2-amino-4,6-bis (trichloromethyl)-S-triazine, and 2-(P-methoxystyryl)-4,6-bis(trichloromethyl)-S-triazine; organic peroxides, which are described in JP-A No. 59-189340, such as methyl ethyl ketone peroxide, cyclohexanone peroxide, 3,3,5-trimethylcyclohexanone peroxide, benzoyl peroxide, di-tert-butyldiperoxyisophthalate, 2,5-dimethyl-2,5-di (benzoylperoxy)hexane, tert-butyl peroxybenzoate, a,a'-bis (tert-butylperoxyisopropyl)benzene, dicumyl peroxide, and 3,3',4,4'-tetra-(tert-isobutylpersoxycarbonyl)benzophenone; an adinium salt described in U.S. Pat. No. 4,743,530; an organic boron compound; phenyl glyoxalic acid esters such as phenyl glyoxalic acid methyl ester; titanocenes such as bis(η⁵-2,4-cyclopentadiene-1-yl)-bis(2,6-difluoro-3-(1H-pyrrole-1-yl)-phenyl)titanium; iron allene complexes such as η⁵-cyclopentadienyl-η⁶-cumenyl-iron(1+)-hexafluorophosphate(1−); diaryliodonium salts such as a diphenyl iodonium salt; triarylsulfonium salts such as triphenyl sulfonium salt.

More detailed examples of compounds of the above-described radical generating agents and examples of other types of radical generating agents include compounds described in paragraphs of from 0067 to 0132 of JP-A No. 10-45816.

Further, the above-described radical generating agents can also be used in a combination of two types or more thereof. For example, a combination of a 2,4,5-triarylimidazole dimer and mercaptobenzoxazole and the like, a combination, which is described in U.S. Pat. No. 3,427,161, of 4,4'-bis(dimethylamino)benzophenone, benzophenone and benzoin methyl ether, a combination, which is described in U.S. Pat. No. 4,239,850, of benzoyl-N-methylnaphthothiazoline and 2,4-bis(trichloromethyl)-6-(4'-methoxyphenyl)-triazole, a combination, which is described in JP-A No. 57-23602, of dialkyl aminobenzoic acid ester and dimethylthioxanthone, a combination, which is described in JP-A No. 59-78339, of three types, namely, 4,4'-bis(dimethylamino)benzophenone, benzophenone and a polyhalogenated methyl compound.

Among the above-described radical generating agents, in view of capability of interacting with a dye in an exposure range to effectively generate the radical thereby enhancing the sensitivity, the organic boron compound, the diaryl iodonium salts, the iron allene complexes, the S-triazine derivative having the trihalogen-substituted methyl group, the organic peroxide, titanocene, the 2,4,5-triarylimidazole dimer, and the adinium salt compound are preferable, and, among other things, the organic boron compound and the 2,4,5-triarylimidazole dimer are particularly preferable. The above-described organic boron compound is preferable from the point that, even when a spectral sensitizing dye is used as a spectral sensitizing compound, the spectral sensitizing dye which is simultaneously present at the time of irradiating light for fixing an image can be decolored excellently. Further, the above-described organic boron compound may simultaneously use the above-described radical generating agent. The above-described 2,4,5-triarylimidazole dimer is favorable, since it is allowed to be highly sensible in an exposure range of 400 nm and a vicinity thereof.

As the organic boron compound, mentioned are a compound represented by the general formula (A) to be described below, and a spectral sensitizing dye type organic boron compound which has the cationic dye described in "Chemistry of Functional Dyes", pp. 393–416, CMC Press, 1981 or "Color Material", 60[4]212–224, 1987 and the like as a cationic part in a structure thereof. As for this spectral sensitizing agent type organic boron compound, mentioned are compounds described in JP-A Nos. 62-143044, 1-138204, No. 6-505287, No. 4-261406 and the like.

As a dye which constitutes the cationic portion of the above-described spectral sensitizing dye type organic boron compound, a cationic dye having a maximum absorption wavelength in a wavelength range of 300 nm or more, preferably from 400 nm to 1100 nm can be used. Among other things, a methine dye, a polymethine dye, a triaryl methane dye, an indoline dye, an azine dye, a xanthene dye, a cyanine dye, a hemicyanine dye, a rhodamine dye, an azomethine dye, an oxazine dye, an acridine dye and the like, all of which are of cationic type, are preferable, and, particularly, the cyanine dye, the hemicyanine dye, the rhodamine dye and the azomethine dye, all of which are of the cationic type, are more preferable.

Among the above-described radical generating agents, the organic boron compound which is represented by the following general formula (A) is favorably used:

General formula (A)

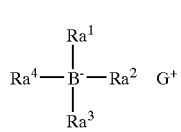

wherein $R_a^1$, $R_2^2$, $R_a^3$, and $R_a^4$ each independently represent an aliphatic group, an aromatic group, a heterocyclic group or $Si(R_a^5)(R_a^6)—R_a^7$; wherein $R_a^5$, $R_a^6$, and $R_a^7$ each independently represent an aliphatic group, or an aromatic group; and $G^+$ represents a group which is capable of forming a cation.

In a case in which $R_a^1$ to $R_a^4$ each independently represent an aliphatic group, examples of such aliphatic groups include an alkyl group, a substituted alkyl group, an alkenyl group, a substituted alkenyl group, an alkynyl group, a substituted alkynyl group, an aralkyl group, and a substituted aralkyl group. Among these groups, the alkyl group, the substituted alkyl group, the alkenyl group, the substituted alkenyl group, the aralkyl group, and the substituted aralkyl group are preferable, and, above all, the alkyl group and the substituted alkyl group are particularly preferable.

Further, the above-described aliphatic groups may either be a cyclic aliphatic group or a chain aliphatic group; on this occasion, the chain aliphatic group may have a branched chain.

The above-described alkyl groups may be of any one of straight-chain, branched-chain, and cyclic types. A number of carbon atoms thereof is preferably from 1 to 30, and more preferably from 1 to 20. These alkyl groups may either be substituted or unsubstituted; on this occasion, a preferable range of a number of carbon atoms of an alkyl portion of the substituted alkyl group is same as in the alkyl group.

Examples of the above-described alkyl groups include a methyl group, an ethyl group, a propyl group, a butyl group, a pentyl group, a hexyl group, a cyclopentyl group, a neopentyl group, an isopropyl group, an isobutyl group, a cyclohexyl group, an octyl group, a 2-ethylhexyl group, a decyl group, a dodecyl group, and an octadecyl group.

Examples of substituents of the above-described substituted alkyl groups include a carboxyl group, a sulfo group, a cyano group, a halogen atom (for example, a fluorine atom, a chlorine atom, or a bromine atom), a hydroxy group, an alkoxycarbonyl group having 30 carbon atoms or less (for example, a methoxycarbonyl group, an ethoxycarbonyl group, or a benzyloxycarbonyl group), an alkylsulfonylaminocarbonyl group having 30 carbon atoms or less, an arylsulfonylaminocarbonyl group, an alkylsulfonyl group, an arylsulfonyl group, an acylaminosulfonyl group having 30 carbon atoms or less, an alkoxy group having 30 carbon atoms or less (for example, a methoxy group, an ethoxy group, a benzyloxy group, or a phenethyloxy group), an alkylthio group having 30 carbon atoms or less (for example, a methylthio group, an ethylthio group, or a dodecylthio group), an aryloxy group having 30 carbon atoms or less (for example, a phenoxy group, a p-tolyloxy group, a 1-naphthoxy group, or a 2-naphthoxy group), a nitro group, an alkyl group having 30 carbon atoms or less, an alkoxycarbonyloxy group, an aryloxycarbonyloxy group, an acyloxy group having 30 carbon atoms or less (for example, an acetyloxy group, or a propionyloxy group), an acyl group having 30 carbon atoms or less (for example, an acetyl group, a propionyl group, or a benzoyl group), a carbamoyl group (for example, a carbamoyl group, an N,N-dimethylcarbamoyl group, a morpholinocarbonyl group, or a piperidinocarbonyl group), a sulfamoyl group (for example, a sulfamoyl group, an N,N-dimethylsulfamoyl group, a morpholinosulfonyl group, or a piperidinosulfonyl group), an aryl group having 30 carbon atoms or less (for example, a phenyl group, a 4-chlorophenyl group, a 4-methylphenyl group, or an α-naphthyl group), a substituted amino group (for example, an amino group, an alkylamino group, a dialkylamino group, an arylamino group, a diarylamino group, or an acylamino group), a substituted ureide group, a substituted phosphono group, or a heterocyclic group. Among above-described groups, the carboxyl group, the sulfo group, the hydroxy group and the phosphono group may each be in a salt state. On this occasion, a cation for use in forming such a salt includes G$^+$ or the like which will be described below.

As the above-described alkenyl groups, any one of straight-chain, branched-chain and cyclic types is permissible. A number of carbon atoms thereof is preferably from 2 to 30, and more preferably from 2 to 20. Further, the above-described alkenyl group may either be substituted or unsubstituted; on this occasion, a preferable range of a number of carbon atoms of an alkenyl portion of the substituted alkenyl group is same as in the alkenyl group.

As substituents of the above-described substituted alkenyl groups, mentioned are same substituents as in the above-described substituted alkyl groups.

As the above-described alkynyl groups, any one of straight-chain, branched-chain and cyclic types is permissible. A number of carbon atoms thereof is preferably from 2 to 30, and more preferably from 2 to 20. Further, the above-described alkynyl group may either be substituted or unsubstituted; on this occasion, a preferable range of a number of carbon atoms of an alkynyl portion of the substituted alkynyl group is same as in the alkynyl group.

As substituents of the substituted alkynyl groups, mentioned are same substituents as in the above-described substituted alkyl groups.

As the above-described aralkyl groups, any one of straight-chain, branched-chain and cyclic types is permissible. A number of carbon atoms thereof is preferably from 7 to 35, and more preferably from 7 to 25. Further, the above-described aralkyl group may either be substituted or unsubstituted; on this occasion, a preferable range of a number of carbon atoms of an aralkyl portion of the substituted aralkyl group is same as in the aralkyl group.

As substituents of the substituted aralkyl groups, mentioned are same substituents as in the above-described substituted alkyl groups.

When the above-described $R_a^1$ to $R_a^4$ each independently represent an aromatic group or an alkyl group, mentioned are, for example, an aryl group and a substituted aryl group as the above-described aromatic substituents. A number of carbon atoms of the aryl group is preferably from 6 to 30, and more preferably from 6 to 20. A preferable range of a number of carbon atoms of an aryl part of the substituted aryl group is same as in the aryl group. Examples of the above-described aryl groups include a phenyl group, an α-naphthyl group, and a β-naphthyl group.

As substituents of the substituted aryl groups, mentioned are same substituents as in the above-described substituted alkyl groups.

When the above-described $R_a^1$ to $R_a^4$ each independently represent a heterocyclic group, mentioned are the heterocyclic group having a substituent and an unsubstituted heterocyclic group as the above-described heterocyclic group. As the substituent of the heterocyclic group having the substituent, mentioned are same substituents as those exemplified in a case in which $R_a^1$ to $R_a^4$ each represent the substituted aryl group.

Among them, as the heterocyclic group which $R_a^1$ to $R_a^4$ each represent, the heterocyclic group having a nitrogen atom, a sulfur atom or an oxygen atom, such as a furan ring, a pyrrole ring, an imidazole ring, an oxazole ring, a thiazole ring, or a pyridine ring is preferable.

When $R_a^1$ to $R_a^4$ each independently represent —Si($R_a^5$)($R_a^6$)—$R_a^7$, $R_a^5$, $R_a^6$, and $R_a^7$ each independently represent an aliphatic group, or an aromatic group. The above-described aliphatic, or aromatic group signifies same aliphatic or aromatic group as that which $R_a^1$ to $R_a^4$ each represent. The same can be said with a preferable example.

In the above-described general formula (A), at least two of $R_a^1$, $R_a^2$, $R_a^3$, and $R_a^4$ may connect with each other either directly or via a substituent to form a ring. When the ring is formed, any one selected from the rings consisting of (C1)

to (C3) described below is preferable as the above-described ring and, among other things, the ring of (C2) is particularly preferable.

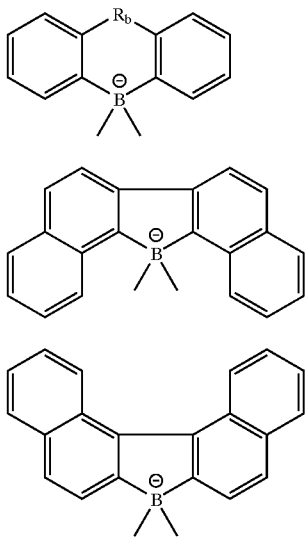

(C1)

(C2)

(C3)

In the ring of the above-described (C1), $R_b$ represents a divalent group described below.

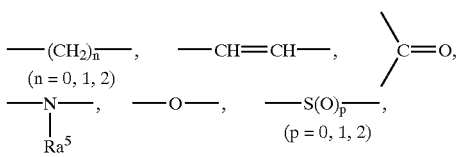

($R_a^5$ represents H or monovalent substituent.)

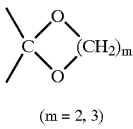

(m = 2, 3)

It is preferable that, among the organic boron compounds represented by the above-described general formula (A), at least one of $R_a^1$ to $R_a^4$ is an alkyl group. Further, it is more preferable that, in view of intensifying sensitivity and enhancing storage stability, one of $R^1$ to $R^4$ is the alkyl group and the remaining three of $R_a^1$ to $R_a^4$ are the organic boron compound of a triarylalkyl type which is an aryl group.

When an acidic substance is present in the recording material, in view of preventing the organic boron compound from being decomposed, in particular, the organic boron compound of the triarylalkyl type in which an aryl group is substituted with an electron-attractive group is preferable; among other things, the organic boron compound in which a sum of Hammet (σ) values of substitutions (electron-attractive groups) on three aryl groups is in a range of from +0.36 to +2.58 is more preferable.

As for the above-described electron-attractive groups, a halogen atom and a trifluoromethyl group are preferable and, particularly, a fluorine atom and a chlorine atom are more preferable.

Examples of the aryl group substituted with the electron-attractive group include a 3-fluorophenyl group, a 4-fluorophenyl group, a 2-fluorophenyl group, a 3-chlorophenyl group, a 4-chlorophenyl group, a 3-trifluoromethylphenyl group, a 4-trifluoromethylphenyl group, a 3,5-difluorophenyl group, a 4-bromophenyl group, a 3,4-difluorophenyl group, a 5-fluoro-2-methylphenyl group, a 5-fluoro-4-methylphenyl group, a 5-chloro-2-methylphenyl group, and a 5-chloro-4-methylphenyl group.

Examples of the anionic portion of the above-described general formula (A) include tetramethyl borate, tetraethyl borate, tetrabutyl borate, triisobutyl methyl borate, di-n-butyl-di-t-butyl borate, tri-m-chlorophenyl-n-hexyl borate, triphenyl methyl borate, triphenyl ethyl borate, triphenyl propyl borate, triphenyl-n-butyl borate, tri(2-methyphehyl) hexyl borate, tri(2-methyphehyl)benzyl borate, trimesityl butyl borate, tritolyl isopropyl borate, triphenyl benzyl borate, tetra-m-fluorobenzyl borate, triphenyl phenethyl borate, triphenyl-p-chlorobenzyl borate, triphenylethenyl butyl borate, di(α-naphthyl)-dipropyl borate, triphenylsilyl triphenyl borate, tritoluylsilyl triphenyl borate, tri-n-butyl (dimethyphenylsilyl)borate, diphenyl dihexyl borate, tri-m-fluorophenyl hexyl borate, tri(5-chloro-4-methyphenyl) hexyl borate, tri-m-fluorophenyl cyclohexyl borate, and tri-(5-fluoro-2-methylphenyl)hexyl borate.

In the above-described general formula (A), $G^+$ represents groups capable of forming a cation. Among the groups, an organic cation type compound, a transition metal-coordinated complex cation (compound described in Japanese Patent No. 2791143 and the like), and a metallic cation (for example, $Na^+$, $K^+$, $Li^+$, $Ag^+$, $Fe^{2+}$, $Fe^{3+}$, $Cu^+$, $Cu^{2+}$, $Zn^{2+}$, $Al^{3+}$, or $½Ca^{2+}$) are preferable.

Examples of the above-described organic cation type compounds include a quaternary ammonium cation, a quaternary pyridinium cation, a quaternary quinolinium cation, a phosphonium cation, an iodonium cation, a sulfonium cation, and a dye cation.

Examples of the above-described quaternary ammonium cations include a tetralkylammonium cation (for example, a tetramethylammonium cation, or a tetrabutylammonium cation), and a tetrarylammonium cation (for example, a tetraphenylammonium cation). Examples of the above-described quaternary pyridiniumammonium cations include an N-alkylpyridinium cation (for example, an N-methylpyridinium cation), an N-arylpyridinium cation (for example, an N-phenylpyridinium cation), an N-alkoxypyridinium cation (for example, a 4-phenyl-N-methoxy-pyridinium cation), and an N-benzoylpyridinium cation. Examples of the above-described quaternary quinolinium cations include an N-alkylquinolinium cation (for example, an N-methylquinolinium cation), and an N-arylquinolinium cation (for example, an N-phenylquinolinium cation). Examples of the above-described phosphonium cations include a tetrarylphosphonium cation (for example, a tetraphenylphosphonium cation). Examples of the above-described iodonium cations include a diaryliodonium cation (for example, a diphenyliodonium cation). Examples of the above-described sulfonium cations include a triarylsulfonium cation (for example, a triphenylsulfonium cation).

Further, specific examples of the above-described $G^+$ include a compound described in paragraphs of from 0020 to 0038 of JP-A No. 9-188686.

In each of the above-described cationic compounds (examplified compounds), as the alkyl group thereof, an alkyl group having carbon atoms of from 1 to 30 is preferable; for example, an unsubstituted alkyl group such as a methyl group, an ethyl group, a propyl group, an isopropyl group, a butyl group, or a hexyl group or the substituted alkyl group represented by $R_a^1$ to $R_a^4$ is preferable. Among other things, an alkyl group having carbon atoms of from 1 to 12 is particularly preferable.

Further, in each of the above-described cationic compounds, as the aryl group thereof, for example, a phenyl group, a halogen atom (for example, chlorine atom)-substituted phenyl group, an alkyl (for example, methyl group)-substituted phenyl group, and an alkoxy (for example, methoxy group)-substituted phenyl group are preferable.

Specific examples of the organic boron compound represented by the above-described general formula (A) include compounds described in U.S. Pat. Nos. 3,567,453 and 4,343,891, JP-A Nos. 62-143044, 62-150242, 9-188684, 9-188685, 9-188686, and 9-188710, JP-B No. 8-9643, and JP-A No. 11-269210, and such compounds as illustrated below. The organic boron compound may be used simultaneously with a radical generating agent described below. However, the organic boron compound according to the present invention is not limited to the above-described organic boron compounds.

b-1
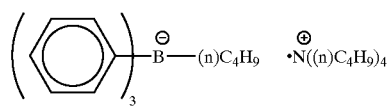

b-2
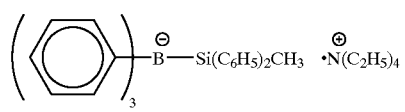

b-3
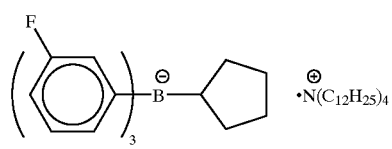

b-4
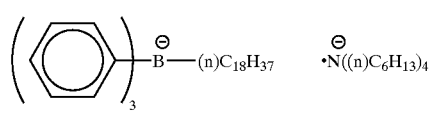

b-5
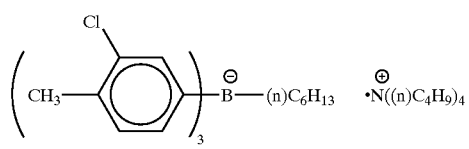

b-6
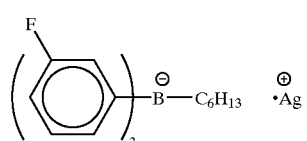

b-7
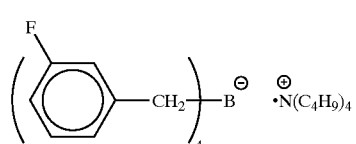

-continued b-8
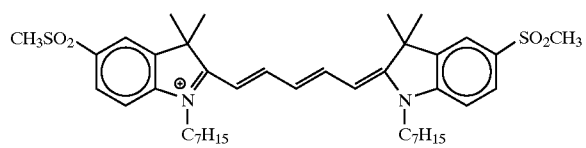

b-9
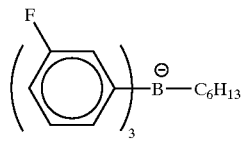

b-10
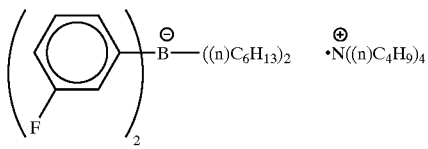

b-11
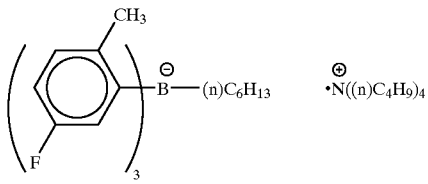

b-12
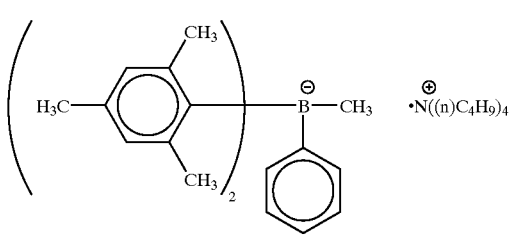

b-13
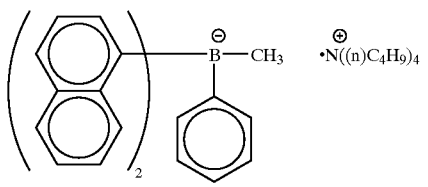

b-14
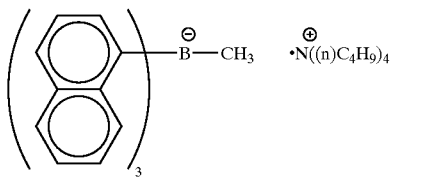

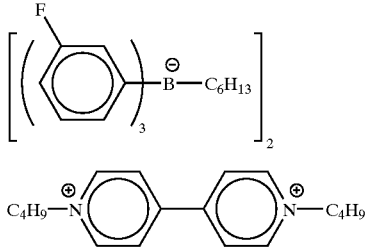

b-15 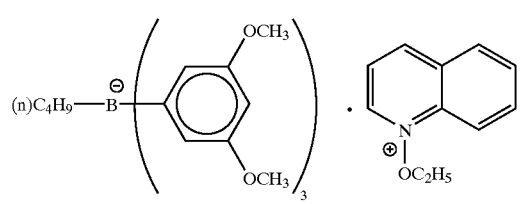
b-16 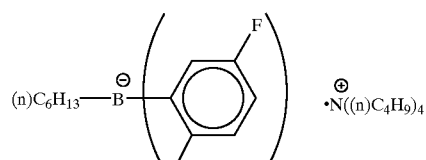
b-17 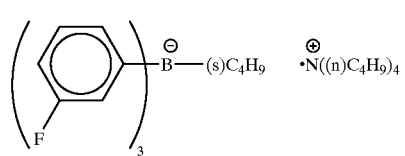
b-18 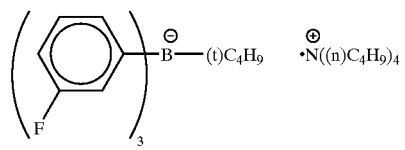
b-19 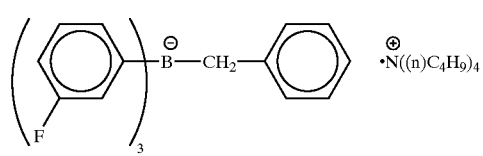
b-20 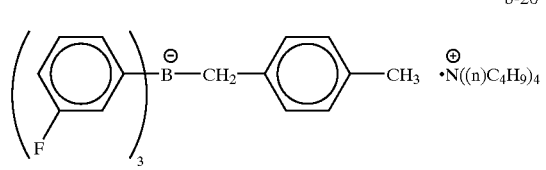
b-21 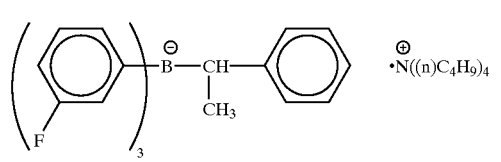
b-22 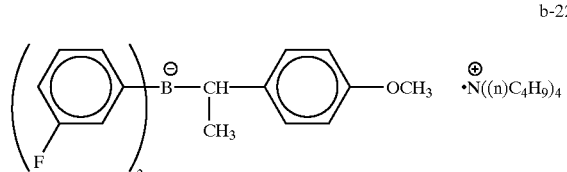
b-23 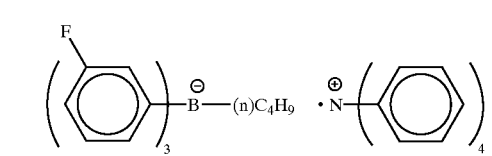
b-24 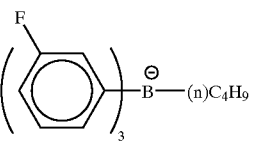
b-25 
b-26 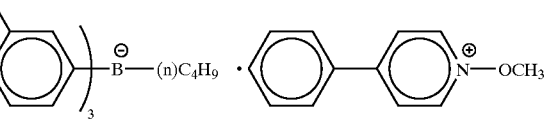
b-27 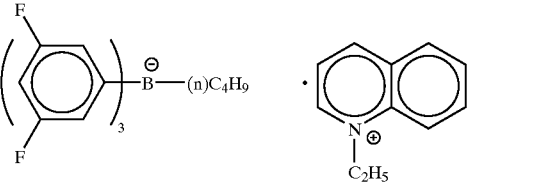
b-28 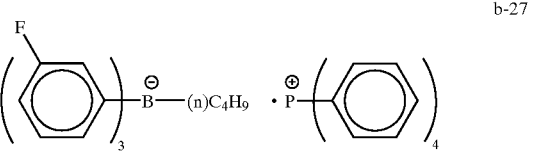
b-29 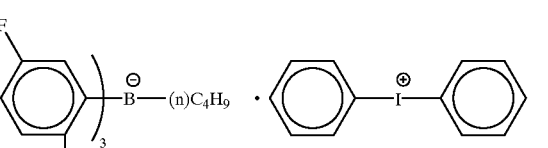
b-30 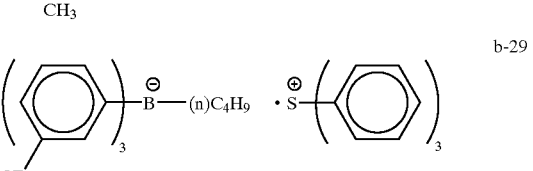
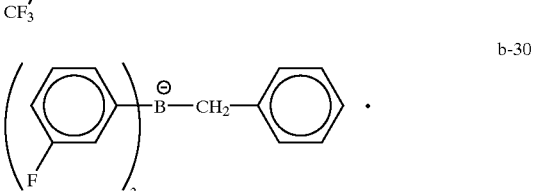
b-31 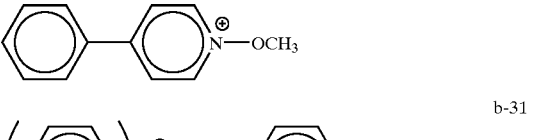
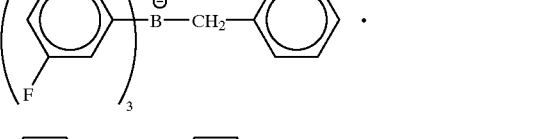

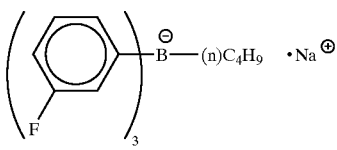
b-32

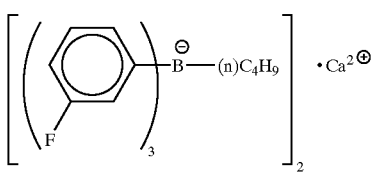
b-33

In order to enhance sensitivity and a decoloration property, a content of the radical generating agent is, based on a total content of the polymerizable compound, preferably from 0.01% by mass to 20% by mass, and more preferably from 0.1% by mass to 10% by mass. However, since such a preferable range as described above changes in accordance with a type of a concurrently employed "polymerizable compound", the present invention is not limited to the above-described preferable range.

Other Components

The recording material according to the present invention may contain a known additive or the like appropriately selected as another component in accordance with objects, so long as such a known additive or the like does not deteriorate an effect.

Examples of the above-described other components include a pigment, wax, an electrically conductive agent, an antistatic agent, an antifoaming agent, an oxygen scavenger, a thermal polymerization inhibitor, an ultraviolet ray absorber, a fluorescent dye, a chain transfer agent, and an antioxidant, and precursors thereof; on this occasion, any one of these components is, based on the total mass of the recording layer, added preferably in a range of from 0.01% by mass to 20% by mass, more preferably from 0.2% by mass to 15% by mass, and particularly preferably from 0.5% by mass to 10% by mass.

Specific examples of additives such as the above-described chain transfer agents, and antioxidants include compounds described in paragraphs of from 0135 to 0141 of JP-A No. 10-45816, in paragraphs of from 0087 to 0096 of JP-A No. 9-188686, in paragraphs of from 0079 to 0118 of JP-A No. 10-182621, and in paragraphs of from 0080 to 0089 of JP-A No. 9-95487 and, further, compounds described in JP-A Nos. 1-13140, 1-13141, 1-13143, 1-13144, 1-17048, 1-229003, 1-298348, 10-138638, 11-269210, and 2-187762.

The recording material according to the present invention may contain a binder in each of a recording layer, an intermediate layer, a protective layer and other layers.

A content of the above-described binder is, based on the total solid content, preferably from 5% by mass to 95% by mass, more preferably from 10% by mass to 90% by mass, and most preferably from 15% by mass to 85% by mass.

The above-described binder can be used depending on fields to be applied and characteristics necessary for the respective fields, such as imparting storage stability in an aqueous system or an organic solvent system, enhancing image fastness, adhesiveness to a substrate, and sensitivity to oxygen.

As the above-described binder, a polymer having a molecular weight of from about 5000 to about 2000000, and preferably from 10000 to 1000000 is desirable. Examples of such polymers as described above include a homopolymer or copolymer of acrylate or methacylate (for example, a copolymer of methyl methacrylate/ethyl acrylate/methacrylic acid, poly(alkyl methacrylate), or poly(alkyl acrylate)), a cellulose ester or a cellulose ether (for example, cellulose acetate, cellulose acetobutyrate, methyl cellulose, or ethyl cellulose), polyvinyl butyral, polyvinyl formal, cyclic rubber, a polyether (for example, polyethylene oxide, polypropylene oxide, or polytetahydrofuran), polystyrene, polycarbonate, polyurethane, chlorinated polyolefin, polyvinyl chloride, a vinyl chloride/vinylidene chloride copolymer, a copolymer of vinylidene chloride and acrylonitrile, methyl methacrylate, vinyl acetate, polyvinyl acetate, a copolymer of ethylene and vinyl acetate, polycaprolactam, poly(hexamethyleneadipamide), a polyester (for example, poly(ethyleneglycol terephthalate), and poly(hexamethyleneglycol succinate)), a polyamide, and polyurea.

As examples thereof, further mentioned are water-soluble polymer compounds such as various types of gelatin, (modified)polyvinyl alcohol, polyvinyl pyrrolidone, a hydrolysate of styrene-maleic acid copolymer, sodium polystyrene sulfonate, and sodium alginate. Furthermore, latices such as styrene-butadiene rubber latex, acrylonitrile-butadiene rubber latex, and methyl acrylate-butadiene rubber latex may be used.

The above-described water-soluble polymer compounds may further be enhanced in the storage stability thereof by being cross-linked. A cross-linking agent to be used on this occasion can appropriately be selected from cross-linking agents well known in the art; for example, mentioned are water-soluble initial condensation products such as N-methylol urea, N-methylol melamine, and urea-formalin; dialdehyde compounds such as glyoxal, and glutaraldehyde; inorganic crosslinking agents such as boric acid and borax; polyamide epichlorohydrin and vinylsulfon compounds.

An unsaturated compound can also be used for a mixture with a non-photopolymerizable film forming component; it is, for example, a physically dried polymer or a polymer solution in an organic solvent, that is, for example, nitrocellulose or cellulose acetobutylate. However, such an unsaturated compound may also be a chemically and/or thermally curable (thermosetting) resin, for example, polyisocyanate, polyepoxide, a melamine resin, or a polyimide precursor. Further, simultaneous employment of the thermosetting resin is important from the reason that it can be used in a system well known in the art as a hybrid system in which a photopolymerization is performed at a first step and, then, cross-linking is executed by a thermal post-treatment at a second step.

Further, a binder having a polymerizable group can also be used.

Furthermore, as an example of another additive, mentioned is a compound described in JP-A No. 11-269210.

When a pigment is contained in the recording material according to the present invention, any of known pigments may be used whichever organic or inorganic. Examples of pigments include kaolin, sintered kaolin, talc, agalmatolite, diatomaceous earth, calcium carbonate, aluminum hydroxide, magnesium hydroxide, zinc oxide, lithopone, amorphous silica, colloidal silica, sintered gypsum, silica, magnesium carbonate, titanium oxide, alumina, barium carbonate, barium sulfate, mica, micro balloon, a urea-formalin filler, polyester particles and a cellulose filler.

In order to enhance fastness or a hue of an azo dye which is generated in the recording material according to the present invention, it is possible to add a metallic salt thereby forming a chelate dye. Examples of the metallic salts include a compound described in paragraphs of from 0109 to 0111 of JP-A No. 2000-247041.

Recording Material

The recording material according to the present invention comprises at least a diazo compound having no diazonio group, a coupler compound which forms color by reacting with the above-described diazo compound and a polymerizable compound on a substrate and may further optionally comprise an underlying layer, an intermediate layer, an ultraviolet ray absorbing layer, a protective layer, a back-coating layer and other layers.

When the recording material is of a multi-color type, the above-described intermediate layer may be provided for the purpose of preventing colors of respective recording layers from being mixed with one another; on this occasion, the intermediate layer is interposed between any two recording layers.

The above-described protective layer may be disposed for the purpose of imparting thermal resistance at the time a whole area of the recording material is heated, an oxygen-barrier property, laminating with an ultraviolet ray absorbing layer, and the like.

Such an intermediate layer, a protective layer, and the like may contain pigment, wax, a surface active agent, a fluorescent whitening agent, an ultraviolet ray absorbing agent and the like.

Further, as necessary, an antihalation layer may be provided either between a substrate and a thermal recording layer or on a surface of a front side of the substrate on which the thermal recording layer is provided, or a layer containing a slipping agent, an antistatic layer, a tacky layer or the like may also be provided on a surface of a back side of the substrate. In a case in which the anti-halation layer is provided, such anti-halation layer as can be decolored by light irradiation, heating, a nucleophilic agent or the like can be provided.

Further, a release paper may be provided on a surface of a reverse side of the support (surface of a side on which a thermal recording layer is not provided) via an adhesive layer to allow the resultant composite to be in a label form.

A basic constitution of the recording material according to the present invention is not particularly limited but can appropriately be determined in accordance with objects.

After the recording material according to the present invention is exposed to light imagewise, the whole area of the recording material is heated to form an image. The recording material according to the present invention may be a photosensitive thermal recording material of either a positive type in which an unexposed portion forms color or a negative type in which an exposed portion forms color.

As a basic aspect, shown below is an example of image forming in a case in which, for example, the recording material according to the present invention is adopted to the positive type of the photosensitive thermal recording material in which a diazo compound is enclosed in a thermally responsible microcapsule.

In the positive type of the photosensitive thermal recording material, the recording layer thereof comprises a diazo compound and a coupler compound having at least a portion which allows the diazo compound to form color and a polymerizable group in a molecule. The recording layer may further comprise another compound as a polymerizable compound (having no color forming portion); on this occasion, it is preferable to allow a thermoplasticizer of the microcapsule to be contained therein. For example, in a case in which the diazo compound is microencapsulated, when the light is irradiated on the recording layer imagewise, the above-described polymerizable compound starts polymerization and is cured to form a latent image. Since a microcapsule wall is non-material-permeable under normal temperature, the photosensitive thermal recording material is in a state in which color has not yet to be formed at this stage.

Thereafter, when heat is applied to the whole area of the photosensitive thermal recording material, the microcapsule wall is shifted to be material permeable, the thermoplasticizer of the microcapsule and the coupler compound in a non-light irradiated portion are diffused and, then, permeated into inside the microcapsule whereupon the diazo compound and the coupler compound are reacted with each other to form color only in a non-light exposed portion. On the other hand, in the light exposed portion, since photopolymerization is performed and, accordingly, curing and setting are performed, the above-described reaction between material permeability does not occur; hence, color is not formed in the light exposed portion. Thereafter, a region in which polymerization has not been performed is also subjected to polymerization (setting) by further exposing the whole area of the above-described photosensitive thermal recording material to light whereupon, further, a dye component contained in the recording layer is decolored.

Further, as another example of the positive type of the photosensitive thermal recording material, the recording layer thereof comprises at least a diazo compound enclosed in a microcapsule, a coupler compound and a thermoplasticizer having a polymerizable group in a molecule as a thermoplasticizer of the microcapsule, the coupler compoud and the thermoplasticizer being present outside the microcapsule. On this occasion, the recording layer may further comprise another compound as a polymerizable compound.

When light is irradiated on this recording layer imagewise, the thermoplasticizer of the microcapsule starts to be polymerized, cured to form a latent image. On this occasion, since a photopolymerized substance of the thermoplasticizer is in a state of lowered thermal diffusivity and being set, the thermoplasticizing performance of the microcapsule is remarkably deteriorated. Thereafter, when heat is applied to the whole area of the photosensitive thermal recording material, since the thermoplasticizer of the microcapsule was set and the thermoplasticizing performance has remarkably been deteriorated in the light exposed portion, the coupler compound can not be diffused into inside the microcapsule whereupon color can not be formed. On the other hand, since the thermoplasticizer of the microcapsule can sufficiently be diffused by heat in the non-light exposed portion, the thermoplasticizing performance of the microcapsule is sufficiently executed and, accordingly, the coupler compound is diffused into inside the microcapsule whereupon the diazo compound is allowed to form color.

Micorcapsule wall heat permeability of the coupler compound can easily be controlled by those who are skilled in the art by means of appropriately selecting a molecular weight or a substituent type of the coupler compound and/or a type of a wall material (for example, polyvalent isocyanate) constituting the microcapsule, a catalyst to be used at the time of microcapsule forming reaction (for example, polyamine, polyol or Sn-compound), temperature, a duration of the reaction time and the like.

On the other hand, as an example of a negative photosensitive thermal recording material, the recording layer thereof comprises at least a diazo compound enclosed in a microcapsule, a coupler compound, a thermoplasticizer of the microcapsule, and a polymerizable compound having a portion which controls plasticizing performance of the microcapsule by interacting with the thermoplasticizer and a polymerizable group, the coupler compoud, the thermoplasticizer, and the polymerizable compound being present outside the microcapsule.

When light exposure is performed imagewise, the thus-exposed portion is polymerized. Thereafter, when heat is applied to the whole area of the photosensitive thermal recording material, since a chemical compound which suppresses the plasticizing performance of the microcapsule by interacting with the thermoplasticizer is polymerized and set in an exposed portion whereupon the thermoplasticizer and the coupler compound are diffused into inside the microcapsule to form color. On the other hand, since the thermoplasticizing performance remains to be suppressed in a non-exposed portion, the coupler compound can not enter the microcapsule whereupon color is not formed.

In the recording material according to the present invention, along with the color forming reaction between the above-described diazo compound and coupler compound, other color forming reactions which make use of a dye precursor described in JP-A No. 12-212464, a compound described in paragraphs of from 0029 to 0100 of JP-A No. 2001-33956, a compound described in JP-A No. 2001-11330, a compound described in JP-A No. 2001-63222, a compound described in JP-A No. 2001-63223, and a compound described in JP-A No. 2001-98181 may be utilized to form a multi-color recording material.

Preparation of Recording Material

The recording material according to the present invention has a recording layer which comprises such a diazo compound as described above, a coupler compound, a polymerizable compound and, optionally, other appropriate components on a support. The recording layer is formed by applying a recording layer coating liquid on the support; on this occasion, one of the diazo compound and the coupler compound is enclosed in a microcapsule and the other one is added to the recording layer coating liquid as an emulsified dispersion liquid. Further, it is preferable that a polymerizable compound is either added to the recording layer coating liquid as the emulsified dispersion liquid or allowed to be present inside the microcapsule. It is preferable that the diazo compound and the coupler compound are added to the recording layer coating liquid as a microcapsule liquid and the emulsified dispersion liquid, respectively. Further, when a compound having a polymerizable group is used as the diazo compound, the coupler compound may be microencapsulated and the above-described diazo compound may be dispersed in the emulsified dispersion liquid. A spectral sensitizing dye and a radical generating agent may be added to the emulsified dispersion liquid or the microcapsule. Microencapsulation and preparation of the emulsified dispersion liquid are performed by methods well known in the art.

Since it is necessary that a polymer substance which forms a microcapsule wall of the above-described microcapsule has a characteristic that is non-permeable in normal temperature and becomes permeable when heated, it is preferable that, particularly, a glass transition temperature thereof is from 60° C. to 200° C.; on this occasion, examples of such polymer substances include polyurethane, polyurea, a polyamide, a polyester, urea, a formaldehyde resin, a melamine resin, polystyrene, a styrene-methacrylate copolymer, a styrene-acrylate copolymer, and mixtures thereof.

As the microcapsule forming method, specifically, an interfacial polymerization method and an internal polymerization method are suitable. Details of the above-described microcapsule forming method and a specific example of a reactant are described in U.S. Pat. Nos. 3,726,804, 3,796,669 and the like. For example, when a polyurea and polyurethane are used as the microcapsule wall material, polyisocyanate and a second substance which reacts with the polyisocyanate to form the microcapsule wall (for example, a polyol, or a polyamine) are mixed into an aqueous medium or an oily medium to be made into the microcapsule wall, these are emulsify- dispersed in water, and, thereafter, heated to cause polymer formation reaction at the interface of an oil drop thereby forming a microcapsule wall. Even if addition of the above-described second substance is omitted, polyurea can be formed.

In the present invention, the polymer substance forming the microcapsule wall preferably contains at least one of polyurethane and polyurea as a component.

An example of the method for producing the microcapsule will be described below by illustrating an example of a method for producing a diazo compound-enclosing microcapsule (polyurea-polyurethane wall).

First, the diazo compound is dissolved or dispersed in a hydrophobic organic solvent to prepare an oil phase which will become a core of the microcapsule. In this case, polyvalent isocyanate is added thereto as a wall material.

At the time of preparing the above-described oil phase, as the hydrophobic organic solvent which dissolve-disperses the diazo compound to form the core of the microcapsule, the organic solvent having a boiling point of 100° C. or more is preferable; on this occasion, examples of such organic solvents include alkylnaphthalene, alkyldiphenyl ethane, alkyldiphenyl methane, alkylbiphenyl, alkylterphenyl, chlorinated paraffin, phosphoric acid esters, maleic acid esters, adipic acid esters, phthalic acid esters, benzoic acid esters, carbonic acid esters, ethers, sulfuric acid esters, and sulfonic acid esters. These compounds may be used in mixtures of two or more, and may be a solid, polymer or an oligomer state at normal temperature.

When solubility of the diazo compound for forming the microcapsule in the above-described organic solvent is inferior, a solvent having a low boiling point and a high dissolving property to the above-described diazo compound can concurrently be used as an auxiliary solvent. Examples of the above-described solvents having a low boiling point include ethyl acetate, propyl acetate, isopropyl acetate, butyl acetate, methylene chloride, tetrahydrofuran, acetonitrile, and acetone.

On the other hand, as an aqueous phase, an aqueous solution into which a water-soluble polymer is dissolved is used and, then, the above-described oil phase is added thereto, and, thereafter, emulsified dispersion is conducted by a device such as a homogenizer. In this operation, the water-soluble polymer acts as a dispersant not only for allowing the dispersion to be uniformly prepared in an easy manner but also for stabilizing the resultant emulsify- dispersed aqueous solution. On this occasion, in order to emulsify-disperse more uniformly and stabilize the resultant emulsify-dispersed aqueous solution, a surfactant may be added to at least one of the oil phase and the aqueous phase.

As for the surfactant, it is possible to use a known surfactant for emulsification. A quantity of the surfactant to be added is, based on the total mass of the oil phase, preferably from 0.1% by mass to 5% by mass, and more preferably from 0.5% by mass to 2% by mass.

The water-soluble polymer used in an aqueous solution of a water-soluble polymer in which the thus-prepared oil phase is dispersed is preferably a water-soluble polymer having a solubility in water of 5% or greater at a temperatures appropriate for emulsification, and as specific examples thereof, there are listed polyvinyl alcohol and denatured materials thereof, a polyacrylic acid amide and derivatives thereof, an ethylene-vinyl acetate copolymer, a styrene-maleic anhydride copolymer, an ethylene-maleic anhydride copolymer, an isobutylene-maleic anhydride copolymer, polyvinylpyrrolidone, an ethylene-acrylic acid copolymer, a vinyl acetate-acrylic acid copolymer, carboxymethylcellulose, methylcellulose, casein, gelatin, starch derivatives, gum arabic, and sodium alginate.

It is preferable that the water-soluble polymer has no reactivity or a low reactivity with an isocyanate compound. For example, a polymer having a reactive amino group in a molecular chain such as gelatin must be previously modified and the like to eliminate the reactivity.

As the polyvalent isocyanate compound to be used, a compound having a 3- or more-functional isocyanate groups is preferable. However, a 2-functional isocyanate compound may be permissible. Specifically, there are listed dimers or trimers (buret or isocyanurate) of diisocyanate main raw materials such as xylylene diisocyanate and hydrogenated materials thereof, hexamethylene diisocyanate, tolylene diisocyanate and hydrogenated materials thereof, and isophorone diisocyanate, polyfunctional adducts of polyols such as trimethylolpropane with 2-functional isocyanates such as xylylene diisocyanate, compounds obtained by introduction of polymer compounds such as a polyether having an active hydrogen such as polyethylene oxide into adducts of polyols such as trimethylolpropane with 2-functional isocyanates such as xylylene diisocyanate, formalin condensation product of benzene isocyanate, and the like.

Specific examples of the polyvalent isocyanate compounds include compounds described in JP-A Nos. 62-212190, 4-26189, and 5-317694, and Japanese Patent Application No. 8-268721. Further, a compound having a radical polymerizable group described in JP-A No. 2000-221673 may be permissible.

A quantity of the polyvalent isocyanate to be used is determined such that an average particle diameter of the microcapsule beomes from 0.3 $\mu$m to 12 $\mu$m and wall thickness thereof becomes from 0.01 $\mu$m to 0.3 $\mu$m. Further, a particle diameter of dispersed particles is ordinarily from about 0.2 $\mu$m to about 10 $\mu$m.

In an emulsify-dispersed liquid in which an aqueous phase is added with an oil phase, a polymerization reaction of the poyvalent isocyanate occurs at an interface between the oil phase and the aqueous phase to form a polyurea wall.

When a polyol and/or a polyamine is previously further added in the hydrophobic solvent solution of the aqueous phase or the oil phase, the polyol and/or the polyamine reacts with the polyvalent isocyanate to form a reaction product which will become one of constitutents of the microcapsule wall. For accelerating a reaction speed, it is preferable that, in the above-described reaction, a reaction temperature is kept high or that an appropriate polymerization catalyst is added.

Specific examples of the polyols and the polyamines include propylene glycol, glycerine, trimethylolpropane, triethanolamine, sorbitol, and hexamethylenediamine. When the polyol is added, a polyurethane wall is formed.

The polyvalent isocyanate, the polyol, the reaction catalyst, and the polyamine for forming a portion of the wall material are described in detail in a published document ("Polyurethane Handbook" edited by Keiji Iwata, Nikkan Kogyo Shimbun, Ltd. (1987)).

Emulsification can be conducted using a known emulsification apparatus appropriately selected from the group consisting of a homogenizer, a Manton-Goalin homogenizer, a supersonic disperser, a dissolver, a Keddy mill and the like. After the emulsification is conducted, the resultant emulsion is heated at from 30° C. to 70° C. to promote a microcapsule wall forming reaction. In order to prevent agglomeration between the resultant microcapsules during the reaction, it is necessary that water is added to decrease probability of mutual collision of the microcapsules, sufficient stirring is conducted, and the like.

Further, during the reaction, a dispersant for preventing agglomeration may be added again. With progress of the polymerization reaction, generation of a carbon dioxide gas is observed, and completion thereof can be regarded as approximate completion of the microcapsule wall forming reaction. Ordinarily, the diazo compound-enclosing microcapsule to be aimed for can be obtained by a reaction over several hours.

The coupler compound to be used in the present invention can be dispersed in solid form together with, for example, a water-soluble polymer, a polymerizable component, an organic base, or any of other color forming auxiliaries by a sand mill and the like and, then, used. However, it is preferable that the coupler compound is previously dissolved in an organic solvent having a high boiling point that is poorly soluble or insoluble in water, and, thereafter, the result solution is mixed with an aqueous solution (aqueous phase) of a polymer having a surfactant and/or a water-soluble polymer as a protective colloid and, then, the resultant mixture is emulsified by a homogenizer or the like to form an emulsified dispersion which is then put in use. On this occasion, a solvent having a low boiling point can optionally be used as a dissolving aid. Further, it is possible that the coupler compound, a polymerizable composition, and an organic base can each independently be emulsify-dispersed, or can first be mixed altogether, dissolved in an organic solvent having a high boiling point and, then, emulsify-dispersed. A preferable emulsify-dispersed particle diameter is 1 $\mu$m or less.

The organic solvent having a high boiling point used in this case can appropriately be selected, for example, from oils having a higher boiling point described in JP-A No. 2-141279. Alternatively, it may be selected from the above-described polymerizable compounds. The above-described oils can be used in a combination thereamong or with any one of other oils.

An auxiliary solvent having a low boiling point can further be added in the above-described organic solvent as a dissolving aid. As such auxiliary solvents, for example, ethyl acetate, isopropyl acetate, butyl acetate, and methylene chloride can preferably mentioned. Depending on occasions, it is also possible that only the auxiliary solvent having a low boiling point can be used, without using the oil having a high boiling point.

The water-soluble polymer to be contained in the aqueous phase as a protective colloid can appropriately be selected from known anionic polymers, nonionic polymers and ampholytic polymers. Among other things, for example, polyvinyl alcohol, gelatin, and cellulose derivatives are preferable.

The surfactant to be contained in the aqueous phase, which is either of an anionic type or of a cationic type and which generates neither precipitation nor agglomeration by reacting with the above-described protective colloid, can appropriately be selected and used. Examples of the surfactants include sodium alkylbenzene sulfonate, sodium alkylsulfate, sodium dioctyl sulfosuccinate, and polyalkylene glycol (for example, polyoxyethylene nonylphenyl ether).

The multi-color recording material, comprising a plurality of mono-color recording layers laminated on a support, is prepared by allowing each of the recording layers to contain a color forming component A which forms a color having a different hue (capable of being enclosed in a microcapsule), a color forming component B which has a portion that forms color by reacting with the color forming component A within a molecule thereof (and which may further have a polymerizable group), and a photopolymerizable composition which is sensitive to light having a different wavelength to form a latent image. In other words, prepared are photopolymerizable compositions which are sensitive to light having different wavelengths by incorporating respective spectral sensitizing dyes having different absorption wavelengths therein. On this occasion, it is preferable that an intermediate layer is provided between any two of the mono-color recording layers.

The recording layer of the multi-color multi-layer recording material according to the present invention can be formed, for example, by the steps of providing on a support a first recording layer comprising a microcapsule enclosing a color forming component $A^C$ which forms cyan color, a color forming component $B^C$ which allows the color forming component $A^C$ to form color, and a photopolymerizable composition which is sensitive to a light source central wavelength $\lambda_1$ to form a latent image, providing on the first layer a second recording layer comprising a microcapsule enclosing a color forming component $A^M$ which forms magenta color, a color forming component $B^M$ which allows the color forming component $A^M$ to form color, and a photopolymerizable composition which is sensitive to a light source central wavelength $\lambda_2$ to form a latent image, and providing on the second recording layer a third recording layer comprising a microcapsule enclosing a color forming component $A^Y$ which forms yellow color, a color forming component $B^Y$ which allows the color forming component $A^Y$ to form color, and a photopolymerizable composition which is sensitive to a light source central wavelength $\lambda_3$ to form a latent image thereby constituting a multi-layer recording layer $\alpha$ having a laminate structure and, further, by optionally interposing an intermediate layer between any two layers of the multi-layer recording layer $\alpha$, thereby constituting a multi-layer recording layer $\beta$.

The recording layer is provided on the support preferably by a coating method which can appropriately be selected from known coating methods, such as, bar coating, blade coating, air knife coating, gravure coating, roll coating, spray coating, dip coating, and curtain coating.

Further, a coating quantity of each thermal recording layer is preferably from 1 g/m² to 30 g/m² on a dry basis.

When image forming is performed by using the recording material having the above-described multi-color multi-layer recording layer, by allowing an image exposure to be performed by using a plurality of light sources having different wavelengths from one another each of which corresponds to an absorption wavelength of each recording layer in a process of performing exposure to light imagewise, recording layers having respective absorption wavelengths relative to light sources selectively form latent images whereupon a multi-color image having a high sensitivity and high sharpness can be formed and, further, by subjecting the whole area of the surface of the recording layer to light irradiation, the base portion colored by the photopolymerizable composition including the spectral sensitizing dye remaining in the layer can be decolored whereupon a multi-color image of a high quality having a high contrast can be formed.

Support

As the above-described support, any of paper supports for use in ordinary pressure-sensitive paper, heat-sensitive paper, dry or wet diazo copying paper, paper used of a silver halide photograph and the like can be used. Acidic paper, neutral paper, coated paper, plastic film laminated paper, synthetic paper, plastic film and the like can also be used. Additives which may be added in the recording material according to the present invention can also be added in the support.

Image Forming

The recording material according to the present invention can form an image by performing light exposure for forming a latent image and, at the same time, or after such light exposure, performing a heat-developing treatment.

A heating method at the time of such heat-developing treatment can use a known method; on this occasion, ordinarily, a heating temperature is preferably from 60° C. to 200° C., and more preferably from 80° C. to 130° C. A duration of heating time is preferably from 0.1 second to 5 minutes, and more preferably from 3 seconds to 1 minute. For heating, a hot roller, a thermal head, an infrared ray lamp, a hot plate and the like can be utilized.

It is preferable that, after the heat-developing treatment is performed, by subjecting the whole surface of the recording layer to light irradiation, a region which remains in an unpolymerized state is polymerized to fix a formed image and, at the same time, a remaining spectral sensitizing dye which will deteriorate whiteness of the base portion is decomposed, decolored and deactivated.

Further, the recording material according to the prevent invention is capable of fixing a formed image by polymerizing an image portion and a non-image portion by subjecting the whole surface of the recording layer to light irradiation after the image is thermally printed by the thermal head or the like.

Furthermore, the recording material according to the present invention is capable of forming a photosensitive pressure-sensitive recording material by using a pressure-sensitive microcapsule.

EXAMPLES

The present invention will now be described in more detail with reference to the following embodiments, but the present invention is not limited thereto. Unless otherwise stated, "%" signifies "% by mass".

Example 1

Preparation of Diazo Compound (1)-Enclosing Microcapsule Liquid

To 13.1 g of ethyl acetate, dissoled were 4.4 g of a diazo compound (1) described below and 10.0 g of diephenyl phthalate, and the resultant solution was further added with 10.5 g of Takenate D-110N (available from Takeda Chemical Industries, Ltd.) and stirred to obtain a uniform mixture liquid (A).

Separately, to 60.0 g of an 8% phthalic acid-modified gelatin, added were 16.6 g of ion-exchanged water, 0.4 g of Sucraph AG-8 (50%)(available from Nippon Seika Co., Ltd.) and, further, the mixture liquid (A) of a diazo compound obtained above and, then, the resultant mixture was emulsify-dispersed by using a homogenizer available from Nippon Seiki Co., Ltd.) for 10 minutes at 40° C. and 7000 rpm.

After the resultant emulsion was added with 20.0 g of ion-exchanged water and 0.25 g of diethylene triamine, the resultant mixture was heated at 40° C. for one hour while stirring and, then, added further with 30.0 g of ion-exchanged water and, thereafter, was heated at 60° C. for 3 hours 20 minutes while stirring. Subsequently, after the thus-stirred mixture was added with 5.5 g of ion exchange resin Amberlite IRA67 (available form Organo Corporation) and 11.0 g of Amberlite IRC50 (available from Organo Corporation) and, then, stirred for one hour, the ion exchange resin in the mixture was removed by filtration. Thereafter, a concentration of the mixture from which the ion exchange resin was removed was adjusted such that a solid content of a microcapsule liquid becomes 30.0%. As a result, the microcapsule liquid enclosing a diazo compound having an average particle size of 1.7 μm was obtained.

Diazo Compound (1)

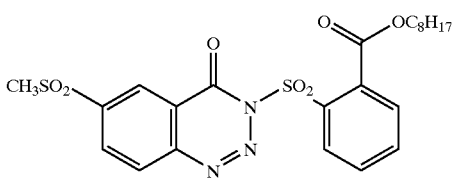

Preperation of Emulsified Liquid of Photopolymerizable Composition (1)

1.0 g of a coupler compound (1) having a polymerizable property described below, 3.0 g of a thermoplasticizer (1) for a microcapsule wall and 0.02 g of a thermal polymerization inhibitor were dissolved in 6.3 g of isopropyl acetate at 75° C. Further, 0.05 g of a spectral sensitizing dye (1) described below and 0.3 g of an organic boron compound (1) were added to the resultant solution and dissolved at 42° C. to obtain a mixed liquid.

Coupler Compound (1)

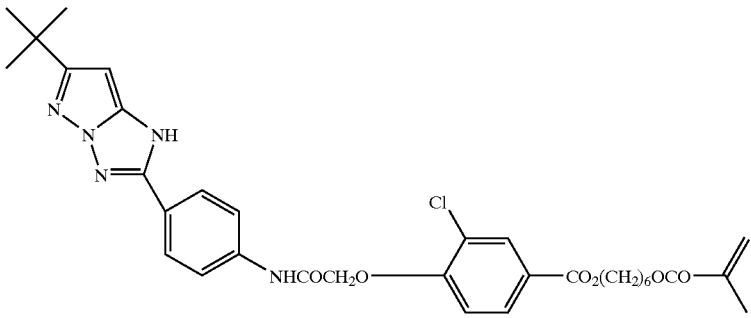

Thermoplasticizer for Microcapsule Wall (1)

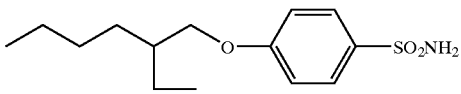

Thermal Polymerization Inhibitor

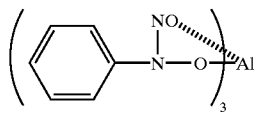

Spectral Sensitizing Dye (1)

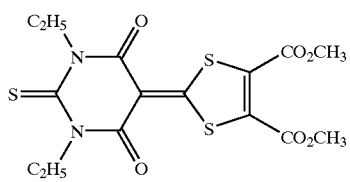

Organic Boron Compound (1)

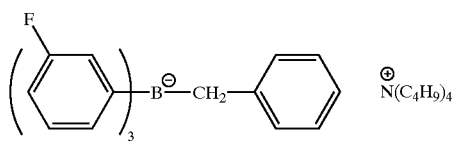

Separately, a mixed liquid comprising 8.3 g of a 15% aqueous solution of gelatin, 7.0 g of a 10% aqueous solution of a surfactant (1) to be described below, 0.62 g of a 20% Julimer-AC10LA (polyacrylic acid, available from Nihon Junyaku Co., Ltd.), and 0.9 g of ion-exchanged water was prepared. The thus-prepared mixed liquid was added with the former mixed liquid and, then, emulsify-dispersed by using a homogenizer (available from Nippon Seiki Co., Ltd.) at 40° C. and 10000 rpm for 5 minutes. Then, the thus-prepared emulsion was subjected to a solvent-removing treatment at 40° C. for 3 hours and, thereafter, a concentration of the thus-treated emulsion was adjusted such that a solid content thereof becomes 30.0% to obtain an emulsion of the photopolymerizable composition.

Surfactant (1)

Preparation of Coating Liquid for Recording Layer 2.0 g of the above-described diazo compound (1)-enclosing microcapsule liquid, 6.6 g of an emulsion of photopolymerizable composition (1), and 0.9 g of a 15% aqueous solution of gelatin were mixed and, thereafter, 4.5 g of ion-exchanged water was added to the resultant mixture to prepare a coating liquid for a recording layer.

Preparation of Coating Liquid for Protective Layer 4.5 g of a 10% aqueous solution of gelatin, 4.5 g of distilled water, 0.5 g of a 2% aqueous solution of a surfactant (2) described below, 0.3 g of a 2% aqueous solution of a surfactant (3) described below, 0.5 g of a 2% aqueous solution of vinyl sulfon type compound (film hardener (1)), "Syloid 72" (available from Fuji Devison Chemical Co., Ltd.), 1 g of "Snowtex N" (available from Nissan Chemical Industries, Ltd.), a UV ray absorber (1) represented by a formula described below, and a UV ray absorber (2) represented by a formula described below were mixed to prepare a coating liquid (1) for protective coating. On this occasion, contents of the above-described "Syloid 72" (available from Fuji Devison Chemical Co., Ltd.), the above-described UV ray absorber (1), and the above-described UV ray absorber (2) were such quantities as are required for allowing respective coating quantities to be 50 mg/m$^2$ on a dry basis, 0.1 g/m$^2$ on a dry basis, and 0.4 g/m$^2$ on a dry basis, respectively.

Surfactant (2)

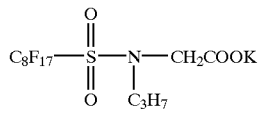

Surfactant (3)

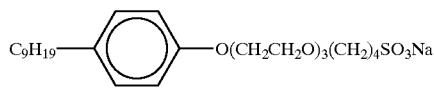

Film Hardener (1)

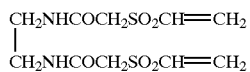

Ultraviolet Ray Absorber (1)

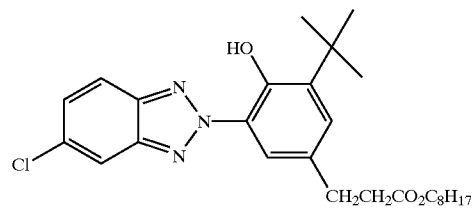

Ultraviolet Ray Absorber (2)

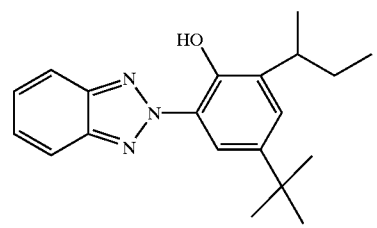

Preparation of Photosensitive Thermal Recording Material

The above-described coating liquid for recording layer was applied on a support for photographic paper in which polyethylene was laminated on high quality paper by using a coating bar such that the coating amount of diazo compound (1) becomes 0.38 g/m$^2$ and, then, dried to form a recording layer.

Thereafter, the above-described coating liquid for a protective layer was applied on the thus-formed recording layer in a laminating manner by using a coating bar such that mass of a coating layer becomes 2.0 g/m$^2$ on a dry basis and, then, dried to obtain a photosensitive thermal recording material (a) according to the present invention.

Examples 2 to 5

Photosensitive thermal recording materials (b) to (e) according to the present invention were obtained in a same manner as in Example 1 except that coupler compounds (2) to (5) described below were used instead of the coupler compound (1) used in Example 1.

Coupler Compound (2)

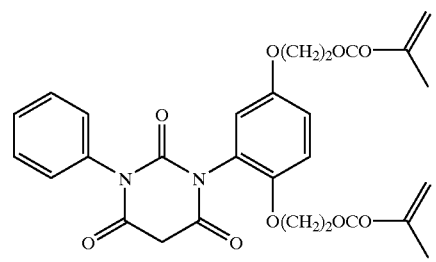

Coupler Compound (3)

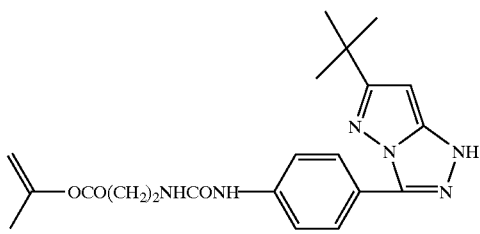

Spectral Sensitizing Dye (2)

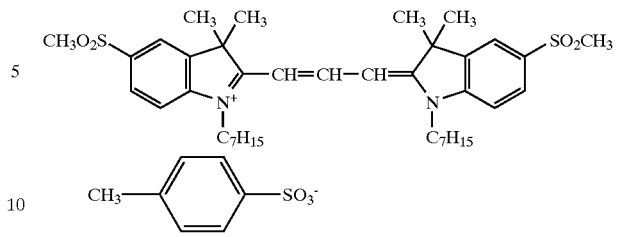

Coupler Compound (4)

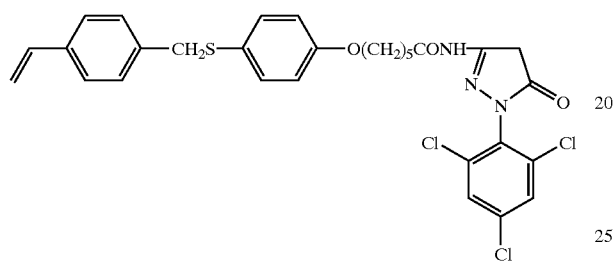

Organic Boron Compound (2)

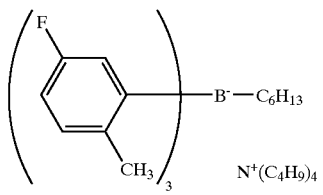

Examples 7 to 12

Photosensitive thermal recording materials (g) to (l) according to the present invention were obtained in a same manner as in Example 1 except that diazo compounds (2) to (7) described below were used instead of the diazo compound (1) used in Example 1.

Coupler Compound (5)

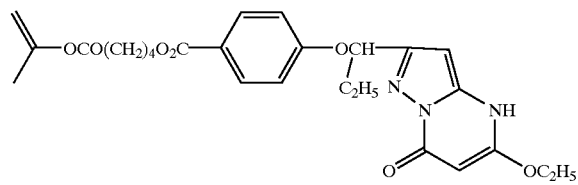

Diazo Compound (2)

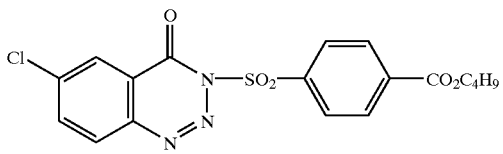

Example 6

A photosensitive thermal recording material (f) was obtained in a same manner as in Example 1 except that a coupler compound (6) was used instead of the coupler compound (1), 0.07 g of a spectral sensitizing dye (2) described below was used instead of 0.05 g of the spectral sensitizing dye (1), and 0.27 g of an organic boron compound (2) described below was used instead of 0.3 g of the organic boron compound (1); in this case, the coupler compound (1), the spectral sensitizing dye (1), and the organic boron compound (1) referred to were used in Example 1.

Diazo Compound (3)

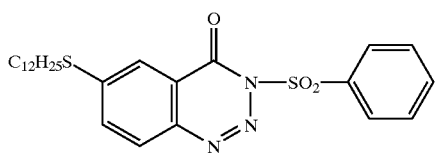

Coupler Compound (6)

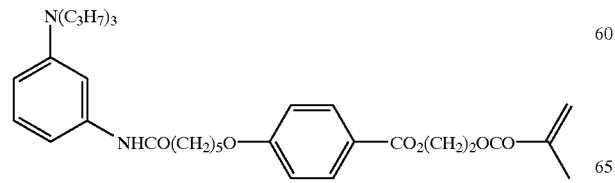

Diazo Compound (4)

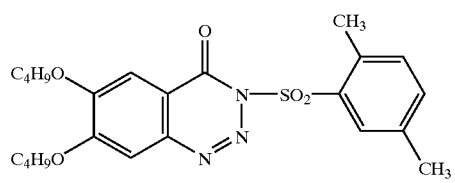

Diazo Compound (5)

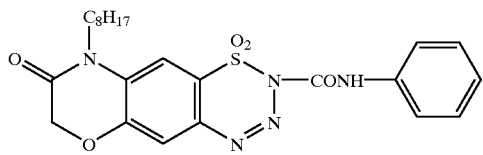

Diazo Compound (6)

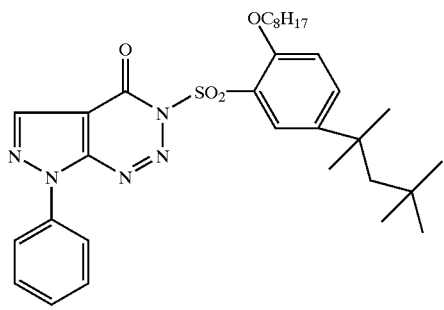

Diazo Compound (7)

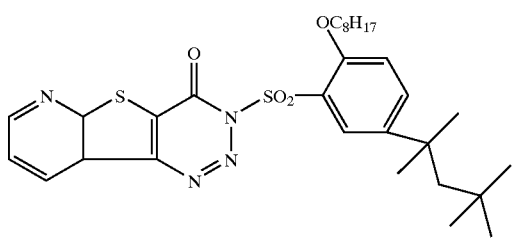

Examples 13 to 15

Photosensitive thermal recording materials (m) to (o) according to the present invention were obtained in a same manner as in Example 1 except that thermoplasticizers (2) to (4) having polymerizable compounds described below were used instead of the thermoplasticizer (1) for the microcapsule wall used in Example 1.

Polymerizable Thermoplasticizer (2)

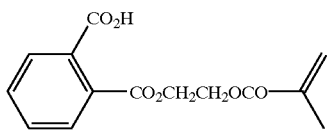

Polymerizable Thermoplasticizer (3)

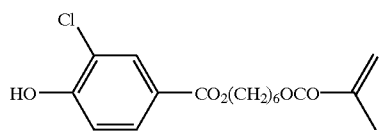

Polymerizable Thermoplasticizer (4)

(monomer for copolymer)

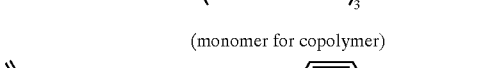

Example 16

Preparation of Coupler Compound (7)-Enclosing Microcapsule Liquid

A coupler compound (7)-enclosing microcapsule liquid was obtained in a same manner as in the preparation of the microcapsule liquid in Example 1 except that 3.8 g of a coupler compound (7) described below was used instead of 4.4 g of the diazo compound (1) used in Example 1.

Coupler Compound (7)

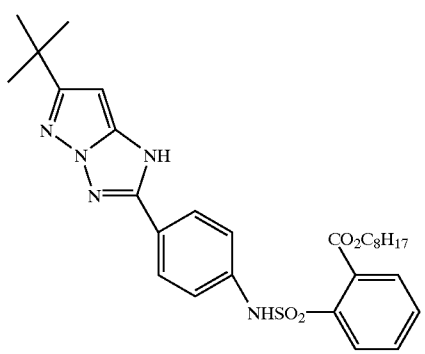

Preparation of Emulsion of Photopolymerizable Composition (2)

An emulsion of a photopolymerizable composition (2) was obtained in a same manner as in the preparation of the photopolymerizable composition in Example 1 except that 0.9 g of a diazo compound (8) having a polymerizable group described below was used instead of 1.0 g of the coupler compound (1) used in Example 1.

Diazo Compound (8)

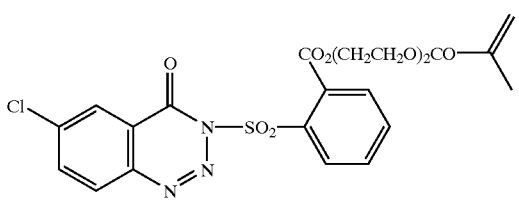

Preparation of Photosensitive Thermal Recording Material

A photosensitive thermal recording materials (p) according to the present invention was obtained in a same manner as in Example 1 except that the above-described coupler compound (7)-enclosing microcapsule liquid was used instead of the diazo compound (1)-enclosing microcapsule liquid, and an emulsified liquid of a photopolymerizable composition (2) was used instead of the emulsified liquid of the photopolymerizable composition (1); in this case, the diazo compound (1)-enclosing microcapsule liquid, the emulsified liquid of the photopolymerizable composition (1) referred to were used in Example 1.

Comparative Examples 1 to 5

A photosensitive thermal recording materials (q) to (u) were obtained in a same manner as in Example 1 except that the above-described coupler compound (7) and coupler compounds (8) to (11) to be described below were used instead of the coupler compound (1) used in Example 1.

Coupler Compound (8)

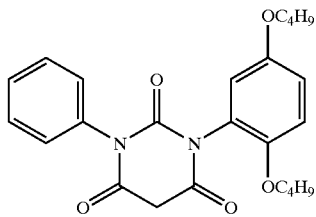

Coupler Compound (9)

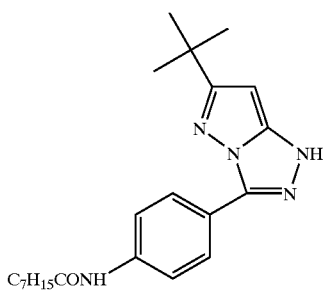

Coupler Compound (10)

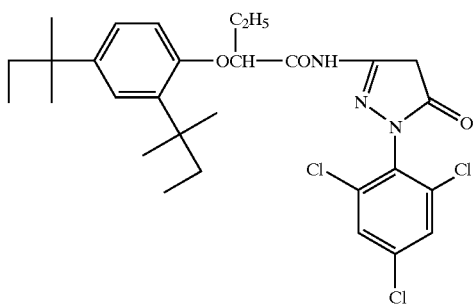

Coupler Compound (11)

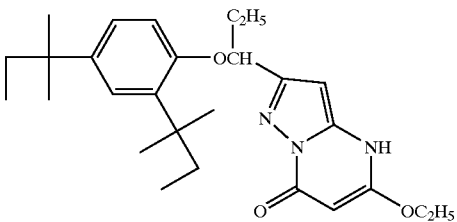

Comparative Example 6

A photosensitive thermal recording materials (v) was obtained in a same manner as in Example 1 except that the a coupler compound (12) described below was used instead of the coupler compound (1), 0.07 g of the above-described spectral sensitizing dye (2) was used instead of 0.05 g of the spectral sensitizing dye (1) and, further, 0.27 g of the above-described organic boron compound (2) was used instead of 0.3 g of the organic boron compound (1); in this case, the coupler compound (1) and the spectral sensitizing dye (1) referred to were used in Example 1.

Coupler Compound (12)

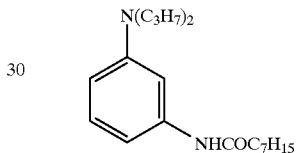

Image Forming and Evaluation

The thus-prepared photosensitive thermal recording materials (a) to (p) according to the present invention and the photosensitive thermal recording materials (q) to (v) of Comparative Examples were each irradiated by light emitted from a 500 W xenon lamp through a step wedge and an SC38 filter for 30 seconds by utilizing a vacuum printing frame device to form a latent image. Thereafter, the thus-irradiated photosensitive thermal recording materials were each heated by a hot plate having a temperature of 95° C. for 10 seconds.

In the photosensitive thermal recording materials (a) to (p) according to the present invention, it was found that color, which is to be formed when the diazo compound and the coupler compound are reacted with each other, was formed in an unexposed portion whereas color density was low or color itself was not formed in an exposed portion. Regions in which color was not formed were examined and, then, a step number (clear step number) of the step wedge corresponding to a region in which an exposed light quantity was lowest was determined. It was found that, the higher the step number becomes, the higher the sensitivity of the photosensitive thermal recording material becomes. This feature is preferable in view of a high speed photofixation property.

Further, a whole recording layer was irradiated by light for 10 minutes under a fluorescent lamp (38000 lux). It was found that, by this irradiation, the spectral sensitizing dye was decolored to enhance whiteness of a base portion.

In each of the photosensitive thermal recording materials (q) to (v) of Comparative Examples, color was formed on a whole surface thereof regardless of unexposed or exposed portions. This is construed that, since the above-described exposing conditions were too weak to effect a photodecomposition of the above-described diazo compound, color was formed on the whole surface thereof heating the above-described whole surface (95° C. for 10 seconds). (Since the photosensitive thermal recording materials of Comparative Examples do not contain a polymerizable compound, the photodecomposition of the above-described diazo compound is necessary for fixation by light irradiation.

The results are shown in Table 1. Further, when the sensitivity is low and, accordingly, color was formed in all steps, this phenomenon is indicated by the term "solid" in Table 1.

Further, a sample in which a saturated density of the obtained color-formed image appeared was subjected to irradiation by xenon light (85000 lux) for 72 hours by using an Atlas C.I65 Weather-O-Meter (available from Atlas Corp.). The density of the thus-irradiated sample was measured by a reflection densitometer X-Rite 310TR (available from X-Rite, Inc.). A dye residual ratio was computed by the following formula:

Dye residual ratio=Density after xenon light irradiation/Density before xenon irradiation×100

It was found that, the higher the dye residual ration is, the higher the fastness of the image is. The results are shown in Table 1.

TABLE 1

| Photosensitive thermal recording material | Clear step number (step number) | Color formed hue | Dye residual ratio (%) |
|---|---|---|---|
| Example 1 | (a) | 10 | Yellow | 96 |
| Example 2 | (b) | 10 | Yellow | 86 |
| Example 3 | (c) | 9 | Yellow | 90 |
| Example 4 | (d) | 9 | Yellow | 94 |
| Example 5 | (e) | 10 | Yellow | 95 |
| Example 6 | (f) | 10 | Magenta | 90 |
| Example 7 | (g) | 10 | Yellow | 95 |
| Example 8 | (h) | 10 | Yellow | 90 |
| Example 9 | (i) | 10 | Yellow | 90 |
| Example 10 | (j) | 10 | Yellow | 87 |
| Example 11 | (k) | 9 | Yellow | 91 |
| Example 12 | (l) | 9 | Orange | 90 |
| Example 13 | (m) | 11 | Yellow | 95 |
| Example 14 | (n) | 11 | Yellow | 97 |
| Example 15 | (o) | 11 | Yellow | 95 |
| Example 16 | (p) | 10 | Yellow | 95 |
| Comparative Example 1 | (q) | Solid | Yellow | 85 |
| Comparative Example 2 | (r) | Solid | Yellow | 65 |
| Comparative Example 3 | (s) | Solid | Yellow | 80 |
| Comparative Example 4 | (t) | Solid | Yellow | 60 |
| Comparative Example 5 | (u) | Solid | Yellow | 78 |
| Comparative Example 6 | (v) | Solid | Magenta | 73 |

From Table 1, it was found that the photosensitive thermal recording material according to the present invention has high image fastness thereby showing an advantageous performance.

Example 17

A same diazo compound-enclosing microcapsule as in Example 1 was used.

Preparation of Photopolymerizable Composition (3)

5 g of a thermoplasticizer (5) having a polymerizable group to be described below, 0.02 g of a same themopolymerization inhibitor as in Example 1 and 1.2 g of a coupler compound (13) to be described below were dissolved in 6.3 g of isopropyl acetate at 75° C. Then, 0.1 g of a spectral sensitizing dye (3) to be described below, 0.3 g of a radical generating agent to be described below, and 0.05 g of a chain transfer agent to be described below were added to the resultant solution and dissolved at 40° C. to obtain a mixed solution.

Separately, a mixed liquid comprising 8.3 g of a 15% aqueous solution of gelatin, 7.0 g of the above-described 10% aqueous solution of surfactant (1), 0.62 g of a 20% Jurymer AC10LA (polyacrylic acid, available from Nihon Junyaku Co., Ltd.), and 0.9 g of ion-exchanged water was prepared. The thus-prepared mixed liquid was added with the above-obtained mixed solution and, then, emulsify-dispersed by using a homogenizer (available from Nippon Seiki C., Ltd.) at 40° C. and 10000 rpm for 5 minutes. Then, the resultant emulsion was subjected to a solvent-removing treatment at 40° C. for 3 hours and, thereafter, a concentration of the thus-treated emulsion was adjusted such that a solid content thereof becomes 30.0% to obtain an emulsion of the photopolymerizable composition (3).

Thermoplasticizer (5)

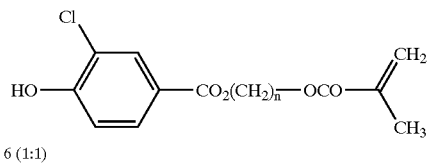

n = 5, 6 (1:1)

Coupler Compound (13)

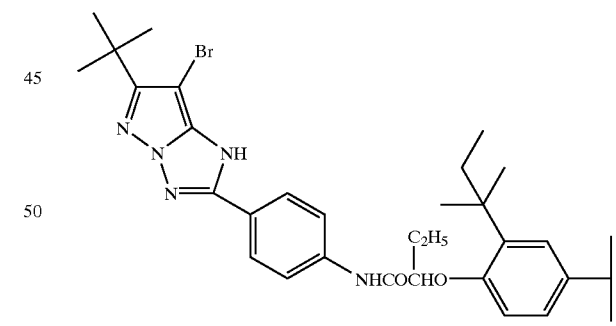

Spectral Sensitizing Dye (3)

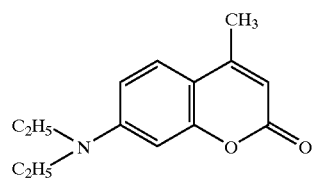

Radical Generation Agent

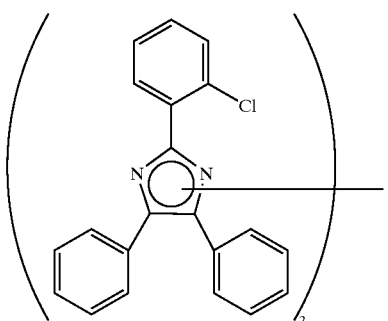

Chain-transfer Agent

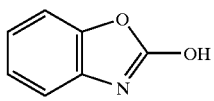

Preparation of Coating Liquid for Recording Layer 2.0 g of the above-described diazo compound (1)-enclosing microcapsule liquid, 6.6 g of an emulsion of photopolymerizable composition (3), and 0.9 g of a 15% aqueous solution of gelatin were mixed and, thereafter, 4.5 g of ion-exchanged water was added to the resultant mixture to prepare a coating liquid for a recording layer.

Preparation of Coating Liquid for Protective Layer 8.8 parts of a 18% aqueous solution of gelatin, 7.0 parts of distilled water, 0.4 part of a 2% aqueous solution of surfactant (4) to be described below, 0.4 part of a 2% aqueous solution of the above-described surfactant (2), 8.8 parts of a 2% aqueous solution of the above-described vinyl sulfon type compound (film hardener (1)), and 1.8 part of a 20% Jurymer-AC10LA (polyacrylic acid, available from Nihon Junyaku Co., Ltd.) were mixed to prepare the coating liquid for protective layer.

Surfactant (4)

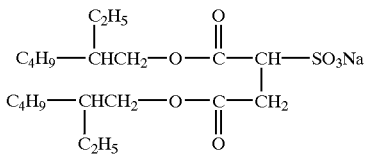

Preparation of Photosensitive Thermal Recording Material

The above-described coating liquid for recording layer was applied on a support for photographic paper in which polyethylene was laminated on high quality paper by using a coating bar such that mass of a whole coating layer becomes 2.7 g/m² on a dry basis and, then, dried to form a recording layer.

Thereafter, the above-described coating liquid for a protective layer was applied on the thus-formed recording layer in a laminating manner by using a coating bar such that mass of a coating layer becomes 2.0 g/m² on a dry basis and, then, dried to obtain a photosensitive thermal recording material (w) according to the present invention.

Comparative Example 7

A photosensitive thermal recording material (x) was obtained in a same manner as in Example 15 except that 5 g of a thermoplasticizer (6) to be described below was used instead of the thermoplasticizer (5) having a polymerizable group used in Example 17.

Thermoplasticizer (6)

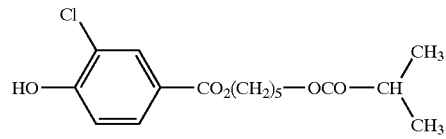

Image Forming and Evaluation

The photosensitive thermal recording material (w) of Example 17 and the photosensitive thermal recording material (x) of Comparative Example 7 were each exposed to light from a side of the protective layer thereof by using a xenon lamp (available from Ushio Inc.) in such a manner as to form a step wedge type image by allowing light having a wavelength of 405 nm to gradually change an irradiation energy thereof while having a maximum irradiation energy of 16.5 mJ/cm². Subsequently, the photosensitive thermal recording material on which a latent image was formed by the above-described light exposure was heated on a hot plate having a temperature of 95° C. for 10 seconds and, thereafter, a whole surface of the thus-heated recording layer was further irradiated by light for 30 minutes by using a fluorescent lamp irradiation device (38000 lux).

As a result, on the recording layer of the photosensitive thermal recording material (w) of Example 17, a yellow color was clearly formed in accordance with exposed energies whereupon a yellow image in a step wedge state was obtained.

A density of the thus-obtained image was measured by an X-Rite densitometer (available from X-Rite, Inc.). The results are shown in Table 2.

TABLE 2

| Irradiation energy (mJ/cm²) | 16.5 | 11.7 | 8.3 | 5.8 | 4.1 | 2.9 | 2.1 | 1.5 | 1 | 0.7 | 0.5 | 0.4 | 0.3 | 0.2 | 0.1 |
|---|---|---|---|---|---|---|---|---|---|---|---|---|---|---|---|
| Yellow color density | 0.1 | 0.1 | 0.1 | 0.1 | 0.1 | 0.11 | 0.1 | 0.1 | 0.36 | 0.95 | 1.57 | 1.73 | 1.79 | 1.82 | 1.8 |

In the photosensitive thermal recording material (x) of Comparative Example 7, color was formed on a whole surface thereof regardless of unexposed or exposed portions thereof whereupon a high-speed photofixation was not able to be performed.

Since the recording material according to the present invention contains a polymerizable compound in the recording layer thereof, it not only shows an excellent performance that fastness is high in an image portion, but also shows other performances that sensitivity is high, and a fixing speed is high. With the recording material of the invention, a highly sensitive image can be recorded and photofixed at high speed using not only ultraviolet light but visible to infrared light in a completely dry processing system that does not require a developing solution and therefore does not generate waste, there is excellent decoloring at non-image portions (background portions), a sharp high-contrast black-and-white or color image can be formed, and there is excellent image fastness.

What is claimed is:

1. A recording material comprising a support having disposed thereon a recording layer including at least a diazo compound having no diazonio group, a coupler compound that colors by reacting with the diazo compound, and a polymerizable compound.

2. The recording material according to claim 1, wherein the recording layer further includes a polymerization initiator.

3. The recording material according to claim 1, wherein the polymerizable compound has an ethylenically unsaturated bond.

4. The recording material according to claim 3, wherein the polymerizable compound includes at least one selected from the group consisting of an acrylic acid ester, an acrylic acid derivative, acrylic acid, an acrylic acid salt, a methacrylic acid ester, a methacrylic acid derivative, methacrylic acid, a methacrylic acid salt, maleic anhydride, a maleic acid ester, itaconic acid, an itaconic acid ester, styrene, a vinyl ether, a vinyl ester, an N-vinylheterocycle, an allyl ether, and an allyl ester.

5. The recording material according to claim 2, wherein the polymerization initiator comprises a compound that absorbs light having a wavelength of 300 nm or longer, and a radical generating agent that generates a radical by interacting with the compound.

6. The recording material according to claim 5, wherein the radical generating agent includes at least one selected from the group consisting of an organic boron compound, a diaryliodonium salt, an iron allene complex, an S-triazine derivative having a trihalogen-substituted methyl group, an organic peroxide, titanocene, a 2,4,5-triarylimidazole dimer, and an adinium salt compound.

7. The recording material according to claim 1, wherein the polymerizable compound comprises a coupler compound.

8. The recording material according to claim 1, wherein the coupler compound includes at least one selected from the group consisting of coupler compounds represented by the following general formulae (C-1) to (C-12):

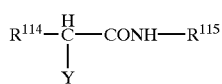
(C-1)

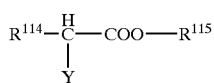
(C-2)

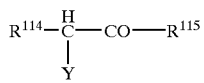
(C-3)

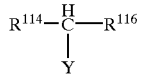
(C-4)

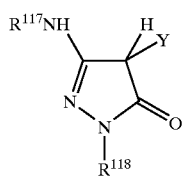
(C-5)

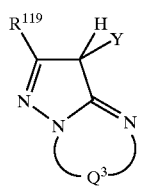
(C-6)

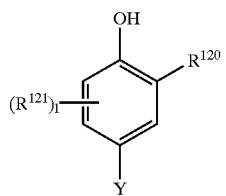
(C-7)

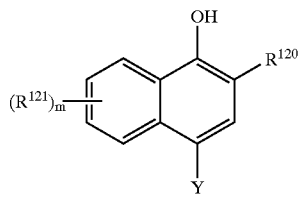
(C-8)

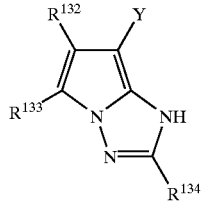
(C-9)

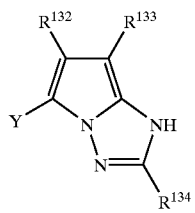
(C-10)

-continued

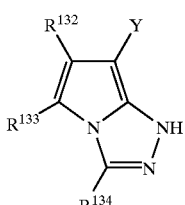

(C-11)

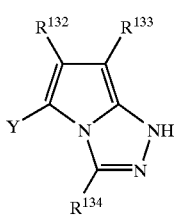

(C-12)

wherein $R^{114}$ represents any one of an acyl group, a cyano group, a nitro group, an aryl group, a heterocyclic residue, an alkoxycarbonyl group, an aryloxycarbonyl group, a carbamoyl group, a sulfamoyl group, an alkylsulfonyl group, and an arylsulfonyl group, and any group may have a substituent;

$R^{115}$ represents any one of an alkyl group, an aryl group, and a heterocyclic residue, and any group may have a substituent;

$R^{116}$ represents an aryl group or a heterocyclic residue, and either group may have a substituent;

Y represents a hydrogen atom or a group releasable by a coupling reaction with the diazo compound;

each of $R^{114}$ and $R^{115}$, and $R^{114}$ and $R^{116}$, may form a ring by bonding with each other;

$R^{117}$ represents any one of an alkyl group, an aryl group, an acyl group and a carbmoyl group;

$R^{118}$ represents a phenyl group, or a phenyl group that is substituted with at least one atom or one group selected from the group consisting of a halogen atom, an alkyl group, a cyano group, an alkoxy group, an alkoxycarbonyl group and an acylamino group;

$R^{119}$ represents a hydrogen atom or a substituent;

$Q^3$ represents a non-metallic atomic group necessary for forming a 5-membered azole ring having 2 to 4 nitrogen atoms, and the azole ring may have a substituent (including a condensation ring);

$R^{120}$ represents a hydrogen atom or a group selected from the group consisting of $-CONR^{122}R^{123}$, $-SO_2NR^{122}R^{123}$, $-NHCOR^{122}$, $-NHCONR^{122}R^{123}$, and $-NHSO_2NR^{122}R^{123}$, with each of $R^{122}$ and $R^{123}$ independently representing a hydrogen atom or a substituent;

$R^{121}$ represents a substituent;

l represents an integer of 0 to 2;

m represents an integer of 0 to 4, and when l and m are each independently 2 or more, plural $R^{121}$ may differ from each other; and each of $R^{132}$, $R^{133}$, and $R^{134}$ independently represents a hydrogen atom or a substituent.

9. The recording material according to claim 1, wherein the polymerizable compound comprises a diazo compound having no diazonio group.

10. The recording material according to claim 1, wherein the diazo compound has a partial skeleton represented by the following general formula (1):

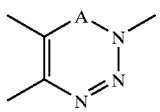

General Formula (1)

wherein A represents —CO— or —SO$_2$—.

11. The recording material according to claim 1, wherein the diazo compound includes a compound represented by the following general formula (2):

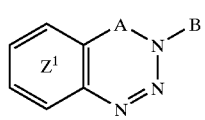

General Formula (2)

wherein A represents —CO— or —SO$_2$—;

B represents an electron-attractive group;

A benzene ring $Z^1$ may be condensed with another benzene ring, and the benzene ring $Z^1$ and a resultant condensation ring may have a substituent.

12. The recording material according to claim 1, wherein the diazo compound includes a compound represented by the following general formula (3):

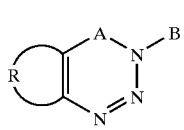

General Formula (3)

wherein A represents —CO— or —SO$_2$—;

B represents an electron-attractive group;

R represents an atomic group necessary for forming a 5- or 6-membered heterocycle.

13. The recording material according to claim 12, wherein the heterocycle formed by R is at least one selected from the group consisting of a nitrogen-containing heterocycle, oxygen-containing heterocycle and sulfur-containing heterocycle.

14. The recording material according to claim 1, wherein a maximum abosorption wavelength of the diazo compound is 450 nm or less.

15. The recording material according to claim 1, wherein the coupler compound or the diazo compound is enclosed in a microcapsule.

16. The recording material according to claim 1, wherein the recording layer includes a microcapsule thermoplasticizer.

17. The recording material according to claim 1, wherein the polymerizable compound is a microcapsule thermoplasticizer.

18. The recording material according to claim 16, wherein the thermoplasticizer includes at least one selected from the group consisting of a phenol derivative, a naphthol derivative, an alkoxy-substituted benzene derivative, an alkoxy-substituted naphthalene derivative, a benzene sulfonamide derivative, and a carbamoylalkyloxybenzene derivative.

19. The recording material according to claim 1, wherein the recording layer includes an organic base.

20. The recording material according to claim 1, further comprising a multi-layer structure comprising a first recording layer which is sensitive to light having a central wavelength $\lambda_1$, a second recording layer which is sensitive to light having a central wavelength $\lambda_2$ to form color different from color to be formed by the first recording layer, . . . , and an i th recording layer which is sensitive to light having a central wavelength $\lambda_i$ to form color different from color to be formed by the first, the second, . . . or the (i−1)th recording layer, wherein the first recording layer, the second recording layer, . . . , the (i−1)th recording layer, the i th recording layer are provided one on another in this order.

* * * * *